(12) United States Patent
Ng et al.

(10) Patent No.: US 11,133,221 B2
(45) Date of Patent: Sep. 28, 2021

(54) METHOD FOR FORMING SEMICONDUCTOR DEVICE STRUCTURE WITH GATE ELECTRODE LAYER

(71) Applicant: Taiwan Semiconductor Manufacturing Co., Ltd., Hsinchu (TW)

(72) Inventors: Jin-Aun Ng, Hsinchu (TW); Sai-Hooi Yeong, Zhubei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/904,024

(22) Filed: Jun. 17, 2020

(65) Prior Publication Data
US 2021/0183707 A1    Jun. 17, 2021

Related U.S. Application Data

(60) Provisional application No. 62/949,273, filed on Dec. 17, 2019.

(51) Int. Cl.
*H01L 21/8238* (2006.01)
*H01L 21/8234* (2006.01)
*H01L 29/417* (2006.01)
*H01L 29/66* (2006.01)
*H01L 29/423* (2006.01)
*H01L 27/092* (2006.01)
(Continued)

(52) U.S. Cl.
CPC ........... *H01L 21/823437* (2013.01); *H01L 21/823431* (2013.01); *H01L 21/823821* (2013.01);
(Continued)

(58) Field of Classification Search
CPC ..... H01L 21/823431; H01L 21/823437; H01L 21/82345; H01L 21/823821; H01L 21/823828; H01L 21/823842; H01L 27/0886; H01L 27/0924; H01L 29/0665; H01L 29/0673; H01L 29/41791;
(Continued)

(56) References Cited

U.S. PATENT DOCUMENTS 9,209,247 B2    12/2015 Colinge et al.
9,236,267 B2    1/2016 De et al.
(Continued)

*Primary Examiner* — Stephen W Smoot
(74) *Attorney, Agent, or Firm* — Birch, Stewart, Kolasch & Birch, LLP

(57) ABSTRACT

A method for forming a semiconductor device structure is provided. The method includes providing a substrate, a plurality of first nanostructures, a plurality of second nanostructures, two tensile epitaxial structures, two compressive epitaxial structures, and a dielectric layer over the substrate. The method includes forming a gate dielectric layer over the first nanostructures and the second nanostructures. The method includes forming a first work function metal layer over the gate dielectric layer over the first nanostructures. The method includes forming a second work function metal layer over the gate dielectric layer over the second nanostructures. The method includes forming a compressive gate electrode layer over the first work function metal layer using an atomic layer deposition process or a chemical vapor deposition process. The method includes forming a tensile gate electrode layer over the second work function metal layer using a physical vapor deposition process.

20 Claims, 27 Drawing Sheets

(51) Int. Cl.
*H01L 29/78* (2006.01)
*H01L 29/06* (2006.01)

(52) U.S. Cl.
CPC ........... *H01L 21/823828* (2013.01); *H01L 21/823842* (2013.01); *H01L 27/0924* (2013.01); *H01L 29/0673* (2013.01); *H01L 29/41791* (2013.01); *H01L 29/42372* (2013.01); *H01L 29/66795* (2013.01); *H01L 29/785* (2013.01); *H01L 2029/7858* (2013.01)

(58) Field of Classification Search
CPC ......... H01L 29/42372; H01L 29/66795; H01L 29/785; H01L 29/7851; H01L 2029/7858
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,008,583 B1* | 6/2018 | Rodder | H01L 29/42392 |
| 10,714,569 B1* | 7/2020 | Kong | H01L 29/16 |
| 10,720,431 B1* | 7/2020 | Cheng | H01L 21/3086 |
| 2015/0270340 A1* | 9/2015 | Frank | H01L 29/41783 257/347 |
| 2018/0069006 A1* | 3/2018 | Kim | H01L 21/823821 |
| 2018/0342427 A1* | 11/2018 | Xie | H01L 21/32133 |
| 2020/0027791 A1* | 1/2020 | Loubet | H01L 29/41725 |
| 2020/0105755 A1* | 4/2020 | Cea | H01L 29/7842 |
| 2020/0251593 A1* | 8/2020 | Miao | H01L 21/823412 |
| 2020/0294863 A1* | 9/2020 | Chiang | H01L 29/0673 |
| 2020/0365467 A1* | 11/2020 | Cheng | H01L 29/0673 |
| 2021/0134951 A1* | 5/2021 | Chen | H01L 29/517 |

* cited by examiner

METHOD FOR FORMING SEMICONDUCTOR DEVICE STRUCTURE WITH GATE ELECTRODE LAYER

PRIORITY CLAIM AND CROSS-REFERENCE

This Application claims the benefit of U.S. Provisional Application No. 62/949,273, filed on Dec. 17, 2019, and entitled "SEMICONDUCTOR DEVICE STRUCTURE WITH GATE AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a perspective view of the semiconductor device structure of FIG. 1A, in accordance with some embodiments.

FIG. 1I-1 is a top view of the semiconductor device structure of FIG. 1I, in accordance with some embodiments.

FIG. 1I-2 is a cross-sectional view illustrating the semiconductor device structure along a sectional line II-II' in FIG. 1I-1, in accordance with some embodiments.

FIG. 1I-3 is a cross-sectional view illustrating the semiconductor device structure along a sectional line III-III' in FIG. 1I-1, in accordance with some embodiments.

DETAILED DESCRIPTION

Figure 1A:
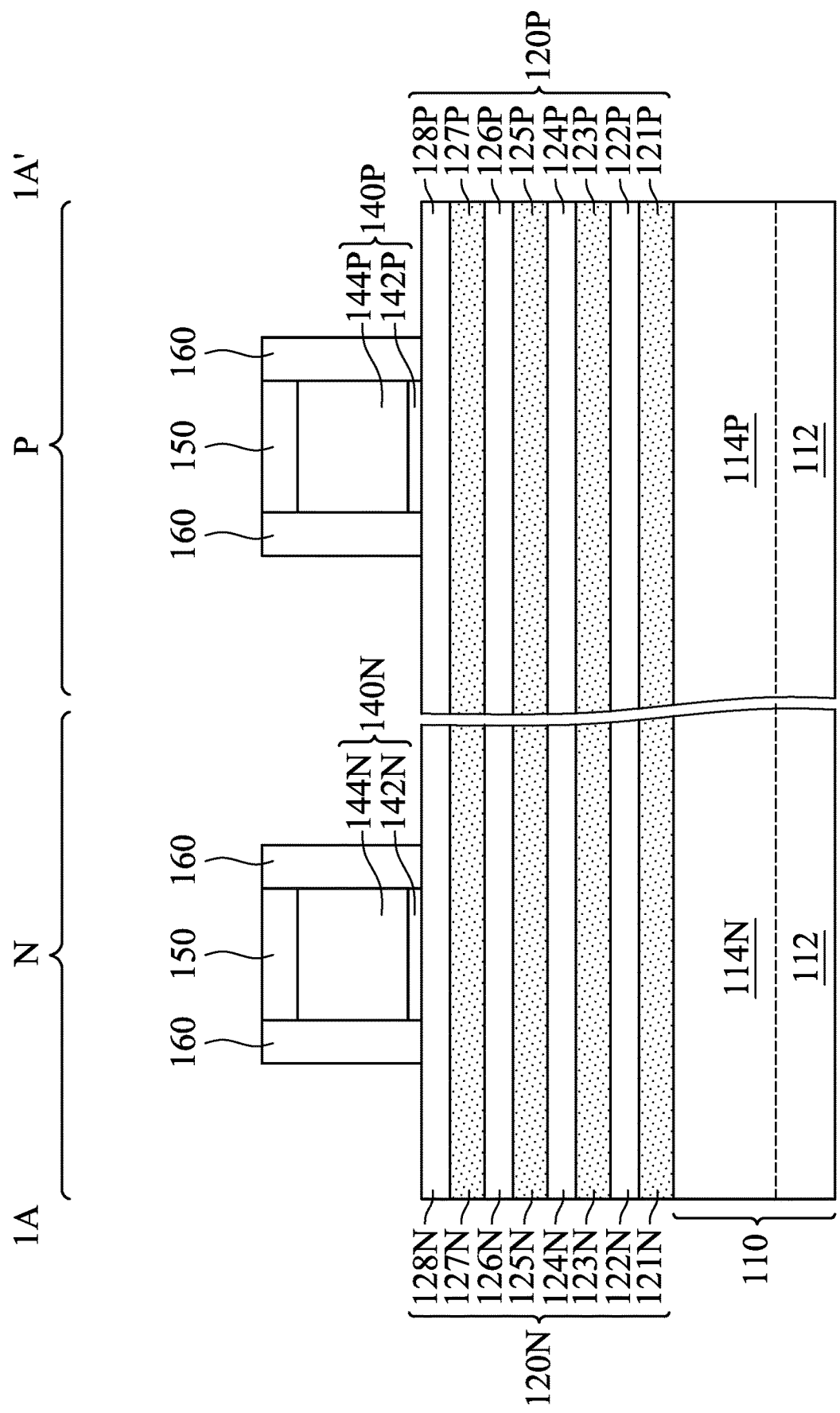
FIGS. 1A-1K are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% or higher, such as 95% or higher, especially 99% or higher, including 100%. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figures 1, 1A:
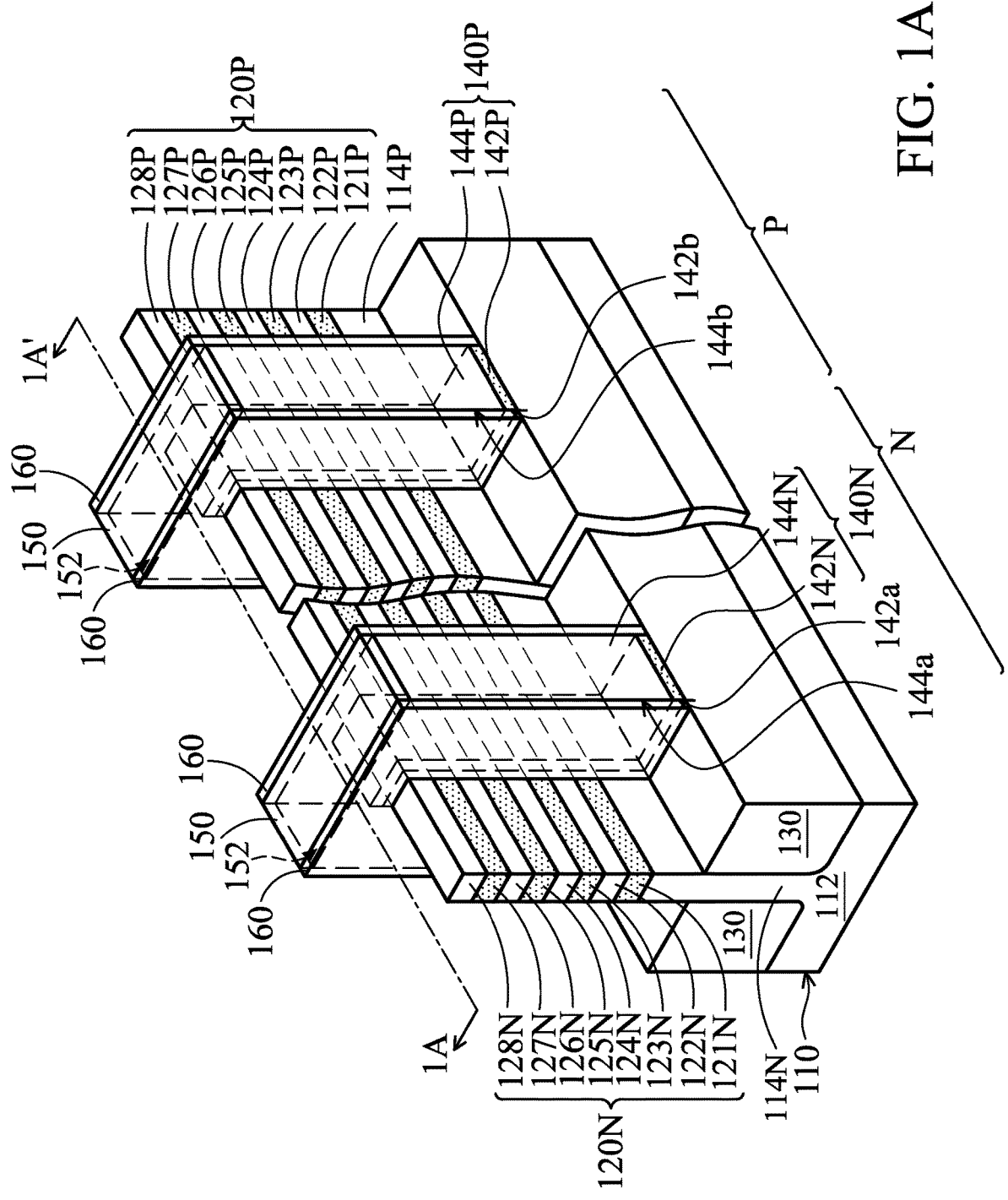

FIGS. 1A-1K are cross-sectional views of various stages of a process for forming a semiconductor device structure, in accordance with some embodiments. FIG. 1A-1 is a perspective view of the semiconductor device structure of FIG. 1A, in accordance with some embodiments.

As shown in FIGS. 1A and 1A-1, a substrate 110 is provided, in accordance with some embodiments. The substrate 110 has a base 112 and fins 114N and 114P over the base 112, in accordance with some embodiments. The substrate 110 has an N-region N and a P-region P, in accordance with some embodiments. In some embodiments, an N-channel metal oxide semiconductor (NMOS) transistor and a P-channel metal oxide semiconductor (PMOS) transistor are formed in the N-region N and the P-region P respectively in the subsequent process.

The substrate 110 includes, for example, a semiconductor substrate. The substrate 110 includes, for example, a semiconductor wafer (such as a silicon wafer) or a portion of a semiconductor wafer. In some embodiments, the substrate 110 is made of an elementary semiconductor material including silicon or germanium in a single crystal structure, a polycrystal structure, or an amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, nanostructure stacks 120N and 120P are formed over the fins 114N and 114P respectively, in accordance with some embodiments. The nanostructure stack 120N includes nanostructures 121N, 122N, 123N, 124N, 125N, 126N, 127N, and 128N, in accordance with some embodiments.

The nanostructures 121N, 122N, 123N, 124N, 125N, 126N, 127N, and 128N are sequentially stacked over the fin 114N, in accordance with some embodiments. The nanostructures 121N, 122N, 123N, 124N, 125N, 126N, 127N, and 128N include nanowires or nanosheets, in accordance with some embodiments.

The nanostructure stack 120P includes nanostructures 121P, 122P, 123P, 124P, 125P, 126P, 127P, and 128P, in accordance with some embodiments. The nanostructures 121P, 122P, 123P, 124P, 125P, 126P, 127P, and 128P are sequentially stacked over the fin 114P, in accordance with some embodiments. The nanostructures 121P, 122P, 123P, 124P, 125P, 126P, 127P, and 128P include nanowires or nanosheets, in accordance with some embodiments.

The nanostructures 121N, 121P, 123N, 123P, 125N, 125P, 127N and 127P are all made of the same first material, in accordance with some embodiments. The first material is different from the material of the substrate 110, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

The nanostructures 122N, 122P, 124N, 124P, 126N, 126P, 128N and 128P are all made of the same second material, in accordance with some embodiments. The second material is different from the first material, in accordance with some embodiments. The second material is the same as the material of the substrate 110, in accordance with some embodiments. The second material includes an elementary semiconductor material including silicon or germanium in a single crystal structure, a polycrystal structure, or an amorphous structure, in accordance with some embodiments.

The second material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

As shown in FIGS. 1A and 1A-1, an isolation layer 130 is formed over the base 112, in accordance with some embodiments. The fins 114N and 114P are partially embedded in the isolation layer 130, in accordance with some embodiments. The fins 114N and 114P are surrounded by the isolation layer 130, in accordance with some embodiments.

The isolation layer 130 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 130 is formed using a deposition process (or a spin-on process), a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

As shown in FIGS. 1A and 1A-1, gate stacks 140N and 140P are formed over the nanostructure stacks 120N and 120P respectively, and a mask layer 150 is formed over the gate stacks 140N and 140P, in accordance with some embodiments. Specifically, the gate stack 140N is formed over the nanostructure stack 120N, the fin 114N, and the isolation layer 130, in accordance with some embodiments. The gate stack 140P is formed over the nanostructure stack 120P, the fin 114P, and the isolation layer 130, in accordance with some embodiments.

The gate stack 140N includes a gate dielectric layer 142N and a gate electrode 144N, in accordance with some embodiments. The gate electrode 144N is over the gate dielectric layer 142N, in accordance with some embodiments. The gate dielectric layer 142N is positioned between the gate electrode 144N and the nanostructure stack 120N, in accordance with some embodiments. The gate dielectric layer 142N is also positioned between the gate electrode 144N and the fin 114N, in accordance with some embodiments. The gate dielectric layer 142N is positioned between the gate electrode 144N and the isolation layer 130, in accordance with some embodiments.

The gate dielectric layer 142N is made of an oxide-containing material such as silicon oxide, in accordance with some embodiments. The gate dielectric layer 142N is formed using a chemical vapor deposition process and an etching process, in accordance with some embodiments. The gate electrode 144N is made of a semiconductor material such as polysilicon, in accordance with some embodiments. The gate electrode 144N is formed using a chemical vapor deposition process and an etching process, in accordance with some embodiments.

The gate stack 140P includes a gate dielectric layer 142P and a gate electrode 144P, in accordance with some embodiments. The gate electrode 144P is over the gate dielectric layer 142P, in accordance with some embodiments. The gate dielectric layer 142P is positioned between the gate electrode 144P and the nanostructure stack 120P, in accordance with some embodiments.

The gate dielectric layer 142P is also positioned between the gate electrode 144P and the fin 114P, in accordance with some embodiments. The gate dielectric layer 142P is positioned between the gate electrode 144P and the isolation layer 130, in accordance with some embodiments.

The gate dielectric layer 142P is made of an oxide-containing material such as silicon oxide, in accordance with some embodiments. The gate dielectric layer 142P is formed using a chemical vapor deposition process and an etching process, in accordance with some embodiments. The gate electrode 144P is made of a semiconductor material such as polysilicon, in accordance with some embodiments. The gate electrode 144P is formed using a chemical vapor deposition process and an etching process, in accordance with some embodiments.

The mask layer 150 is positioned over the gate stacks 140N and 140P, in accordance with some embodiments. The mask layer 150 is made of a different material than the gate stacks 140N and 140P, in accordance with some embodiments. The mask layer 150 is made of nitrides (e.g., silicon nitride) or oxynitride (e.g., silicon oxynitride), in accordance with some embodiments.

As shown in FIGS. 1A and 1A-1, a spacer structure 160 is formed over sidewalls 142a, 144a and 152 of the gate dielectric layer 142N, the gate electrode 144N and the mask layer 150 thereover and sidewalls 142b, 144b and 152 of the gate dielectric layer 142P, the gate electrode 144P and the mask layer 150 thereover, in accordance with some embodiments.

The spacer structure 160 surrounds the gate stacks 140N and 140P and the mask layer 150, in accordance with some embodiments. The spacer structure 160 is positioned over the nanostructure stacks 120N and 120P, the fin structures 114N and 114P and the isolation layer 130, in accordance with some embodiments.

The spacer structure 160 includes insulating materials, such as silicon oxide, silicon nitride, silicon oxynitride, or silicon carbide, in accordance with some embodiments. The spacer structure 160 is made of a material different from that of the gate stacks 140N and 140P and the mask layer 150, in accordance with some embodiments. The formation of the spacer structure 160 includes deposition processes and an anisotropic etching process, in accordance with some embodiments.

Figure 1B:
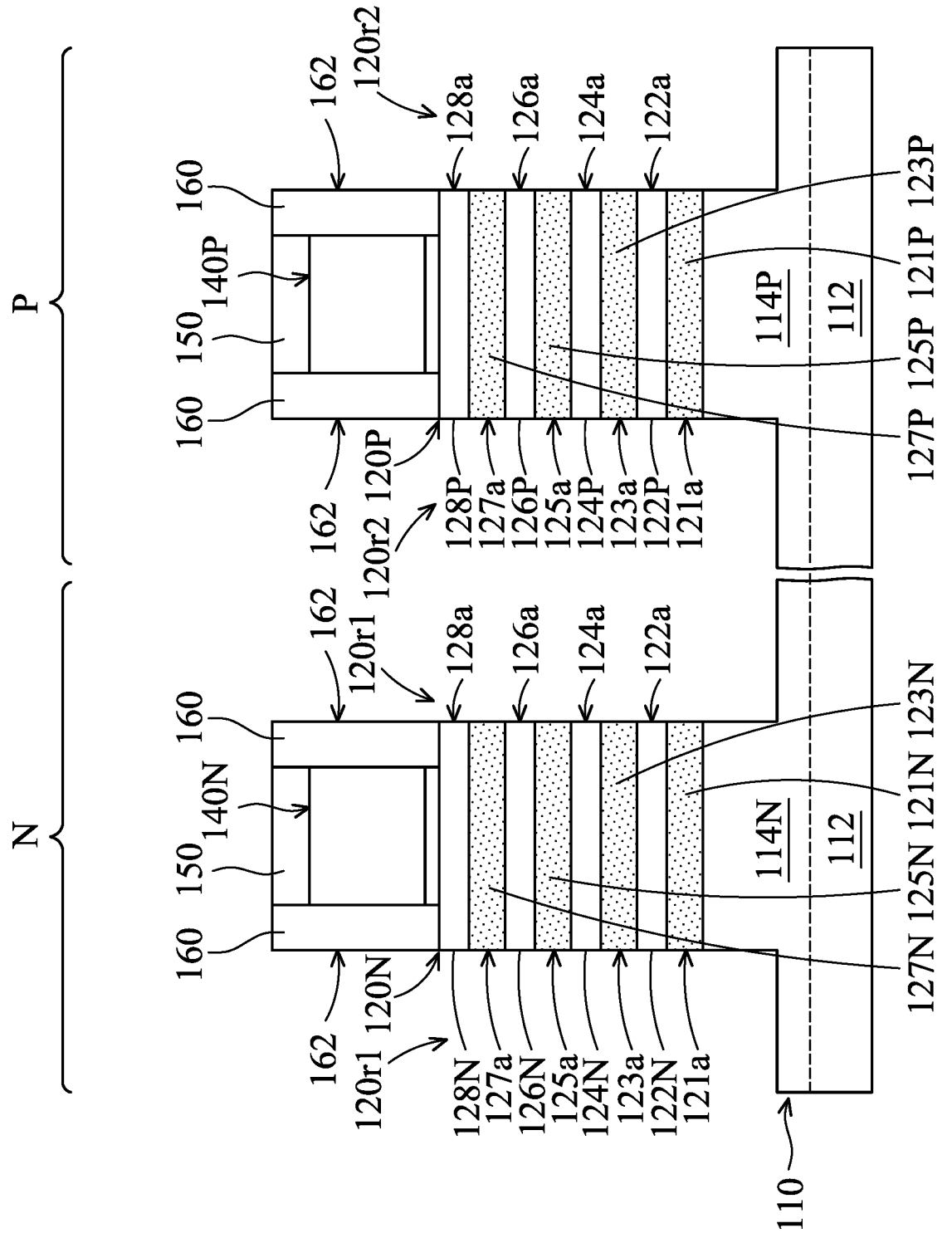

As shown in FIG. 1B, end portions of the nanostructures 121N, 121P, 122N, 122P, 123N, 123P, 124N, 124P, 125N, 125P, 126N, 126P, 127N, 127P, 128N and 128P, which are not covered by the gate stacks 140N and 140P and the spacer structure 160, are removed, in accordance with some embodiments. The removal process forms trenches 120r1 and 120r2 in the nanostructure stacks 120N and 120P respectively, in accordance with some embodiments.

As shown in FIG. 1B, sidewalls 121a, 122a, 123a, 124a, 125a, 126a, 127a and 128a of the nanostructures 121N, 122N, 123N, 124N, 125N, 126N, 127N and 128N are substantially aligned with (or substantially coplanar with) sidewalls 162 of the spacer structure 160 over the nanostructure stack 120N, in accordance with some embodiments.

As shown in FIG. 1B, sidewalls 121a, 122a, 123a, 124a, 125a, 126a, 127a and 128a of the nanostructures 121P, 122P, 123P, 124P, 125P, 126P, 127P and 128P are substantially aligned with (or substantially coplanar with) sidewalls 162 of the spacer structure 160 over the nanostructure stack 120P, in accordance with some embodiments. The removal process includes an etching process, in accordance with some embodiments. The etching process includes an anisotropic etching process such as a dry etching process, in accordance with some embodiments.

Figure 1C:
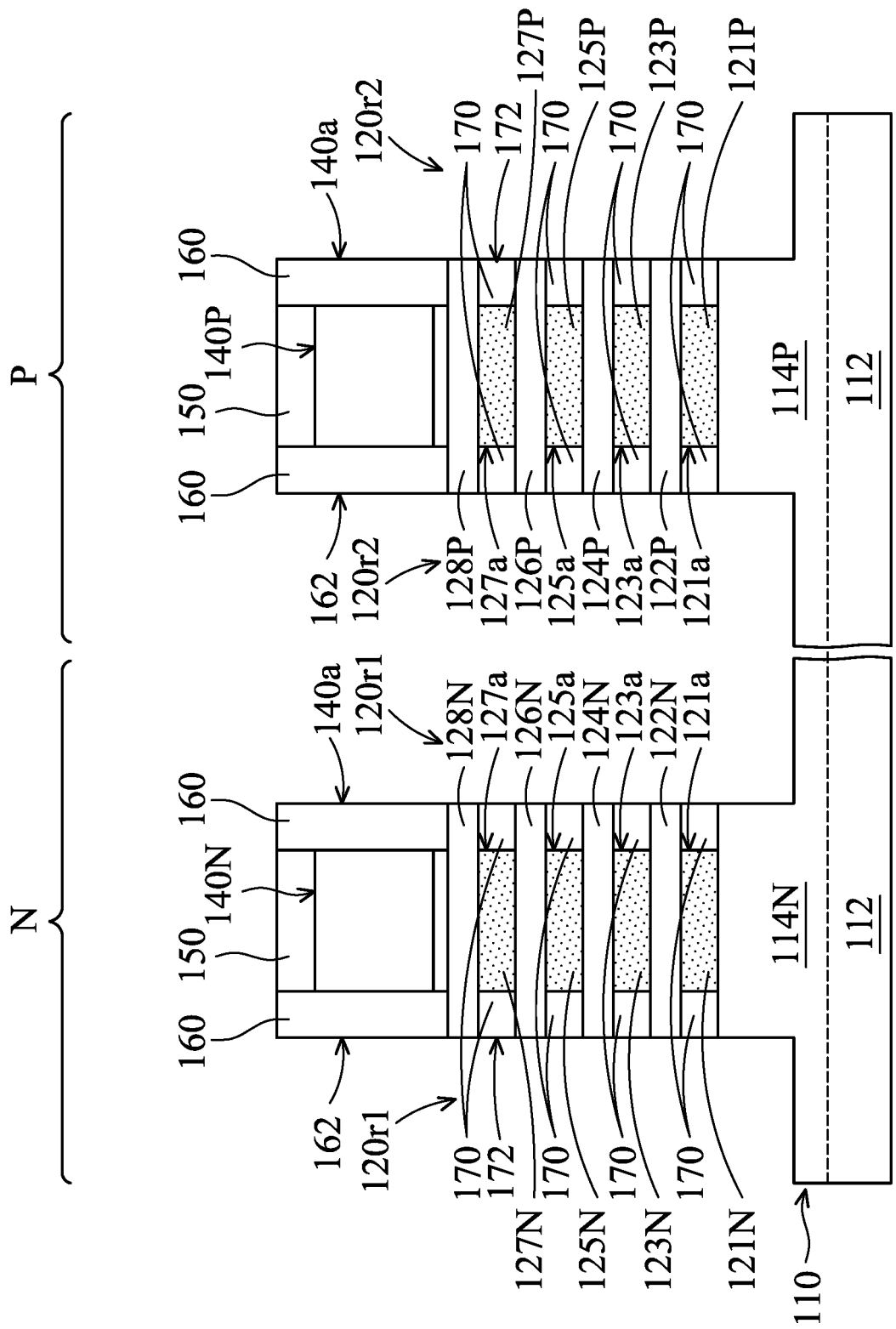

As shown in FIG. 1C, portions of the nanostructures 121N, 121P, 123N, 123P, 125N, 125P, 127N and 127P are removed through the trenches 120r1 and 120r2, in accordance with some embodiments. The removal process includes an etching process such as a dry etching process or a wet etching process, in accordance with some embodiments.

As shown in FIG. 1C, an inner spacer layer 170 is formed over the sidewalls 121a, 123a, 125a and 127a of the nanostructures 121N, 121P, 123N, 123P, 125N, 125P, 127N and 127P, in accordance with some embodiments. The inner spacer layer 170 is in direct contact with the sidewalls 121a, 123a, 125a and 127a, in accordance with some embodiments. As shown in FIG. 1C, sidewalls 172 of the inner spacer layer 170 are substantially aligned with (or substantially coplanar with) the sidewalls 162 of the spacer structure 160, in accordance with some embodiments.

The inner spacer layer 170 is made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The term "high-k material" means a material having a dielectric constant greater than the dielectric constant of silicon dioxide, in accordance with some embodiments. The term "low-k material" means a material having a dielectric constant less than the dielectric constant of silicon dioxide, in accordance with some embodiments.

In some embodiments, the inner spacer layer 170 is formed using a deposition process and an etching process. The deposition process includes a physical vapor deposition process, a chemical vapor deposition process, an atomic layer deposition process, or the like, in accordance with some embodiments.

In some other embodiments, the inner spacer layer 170 is formed using a selective deposition process such as an atomic layer deposition process. In some still other embodiments, the removal of the portions of the nanostructures 121N, 121P, 123N, 123P, 125N, 125P, 127N and 127P through the trenches 120r1 and 120r2 is not performed, and the inner spacer layer 170 is formed by directly oxidizing the portions of the nanostructures 121N, 121P, 123N, 123P, 125N, 125P, 127N and 127P through the trenches 120r1 and 120r2.

Figure 1D:
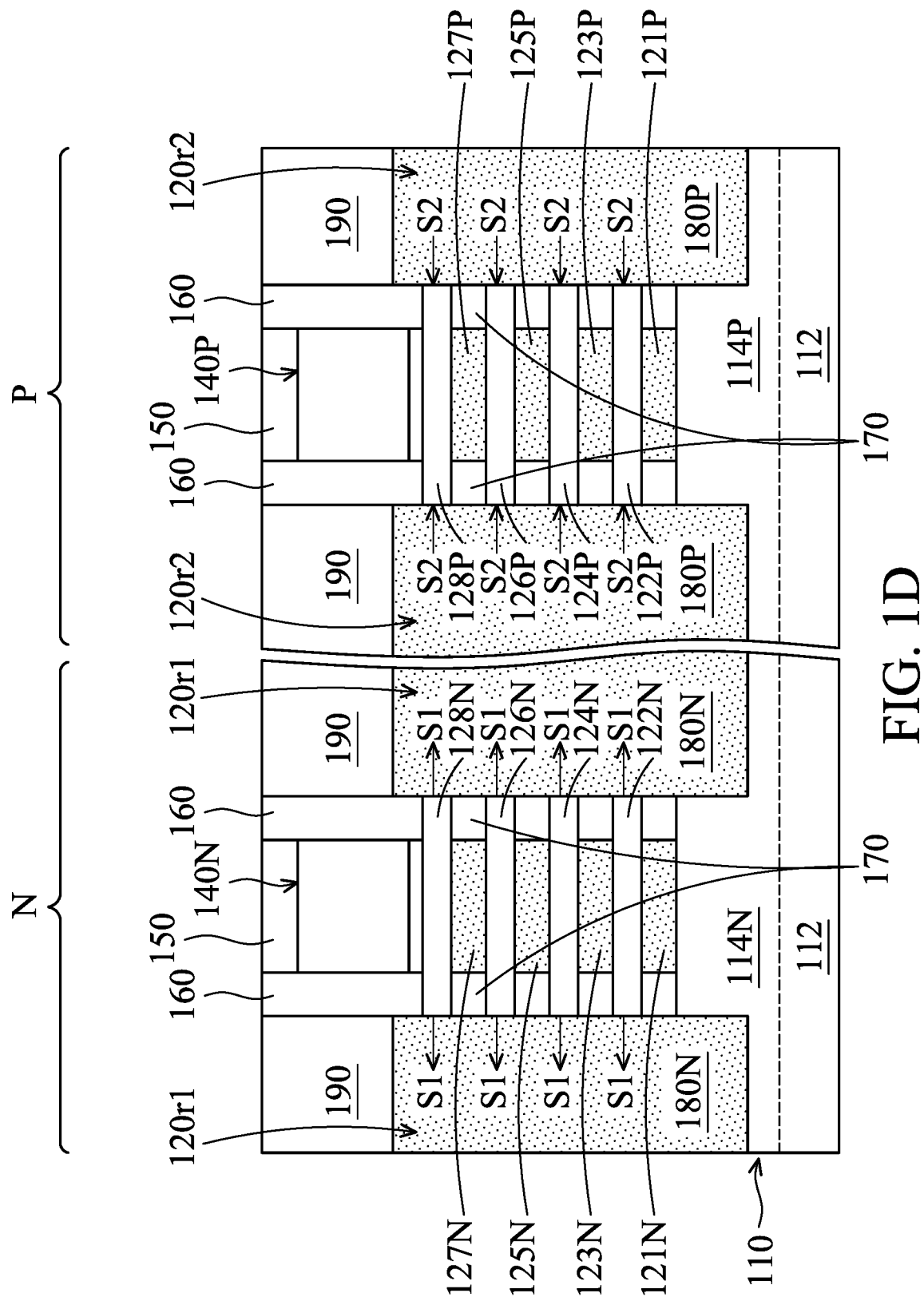

As shown in FIG. 1D, tensile epitaxial structures 180N are formed in the trenches 120r1, in accordance with some embodiments. The nanostructures 122N, 124N, 126N and 128N are between the tensile epitaxial structures 180N, in accordance with some embodiments. The tensile epitaxial structures 180N are in direct contact with the nanostructures 122N, 124N, 126N and 128N, the spacer structure 160, the inner spacer layer 170, and the substrate 110, in accordance with some embodiments.

The tensile epitaxial structures 180N are used to provide a tensile stress S1 to the nanostructures 122N, 124N, 126N and 128N (i.e. channel structures) so as to induce a tensile strain in the nanostructures 122N, 124N, 126N and 128N, in accordance with some embodiments. The tensile strain is along a longitudinal axis A1 of the nanostructures 122N, 124N, 126N and 128N (or the nanostructures 122P, 124P, 126P and 128P), in accordance with some embodiments. The tensile epitaxial structures 180N are used to be a source structure and a drain structure, in accordance with some embodiments.

In some embodiments, the tensile epitaxial structures 180N are made of a semiconductor material (e.g., silicon or silicon carbide), which is able to provide the tensile stress S1 to the nanostructures 122N, 124N, 126N and 128N. The tensile epitaxial structures 180N are doped with N-type dopants, such as the Group VA element, in accordance with some embodiments. The Group VA element includes phosphor (P), antimony (Sb), or another suitable Group VA material.

The tensile epitaxial structures 180N are formed using an epitaxial process, in accordance with some embodiments. In some embodiments, the trenches 120r2 are covered by a mask layer (not shown) during the formation of the tensile epitaxial structures 180N, and the mask layer is removed after the formation of the tensile epitaxial structures 180N.

As shown in FIG. 1D, compressive epitaxial structures 180P are formed in the trenches 120r2, in accordance with some embodiments. The nanostructures 122P, 124P, 126P and 128P are between the compressive epitaxial structures 180P, in accordance with some embodiments. The compressive epitaxial structures 180P are in direct contact with the nanostructures 122P, 124P, 126P and 128P, the spacer structure 160, the inner spacer layer 170, and the substrate 110, in accordance with some embodiments.

The compressive epitaxial structures 180P are used to provide a compressive stress S2 to the nanostructures 122P, 124P, 126P and 128P (i.e. channel structures) so as to induce a compressive strain in the nanostructures 122P, 124P, 126P and 128P, in accordance with some embodiments. The compressive strain is along the longitudinal axis A1 of the nanostructures 122P, 124P, 126P and 128P (or the nanostructures 122N, 124N, 126N and 128N), in accordance with some embodiments. The compressive epitaxial structures 180P are used to be a source structure and a drain structure, in accordance with some embodiments.

In some embodiments, the compressive epitaxial structures 180P are made of a semiconductor material (e.g., silicon germanium), which is able to provide the compressive stress S2 to the nanostructures 122P, 124P, 126P and 128P. The compressive epitaxial structures 180P are doped with P-type dopants, in accordance with some embodiments. The P-type dopants include the Group IIIA element, in accordance with some embodiments. The Group IIIA element includes boron or another suitable material.

The compressive epitaxial structures 180P are formed using an epitaxial process, in accordance with some embodiments. In some embodiments, the tensile epitaxial structures 180N are covered by a mask layer (not shown) during the formation of the compressive epitaxial structures 180P, and the mask layer is removed after the formation of the compressive epitaxial structures 180P.

As shown in FIG. 1D, a dielectric layer 190 is formed over the tensile epitaxial structures 180N and the compressive epitaxial structures 180P, in accordance with some embodiments. The dielectric layer 190 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 190 is formed by a deposition process (e.g., a chemical vapor deposition process) and a planarization process (e.g., a chemical mechanical polishing process), in accordance with some embodiments.

Figure 1E:
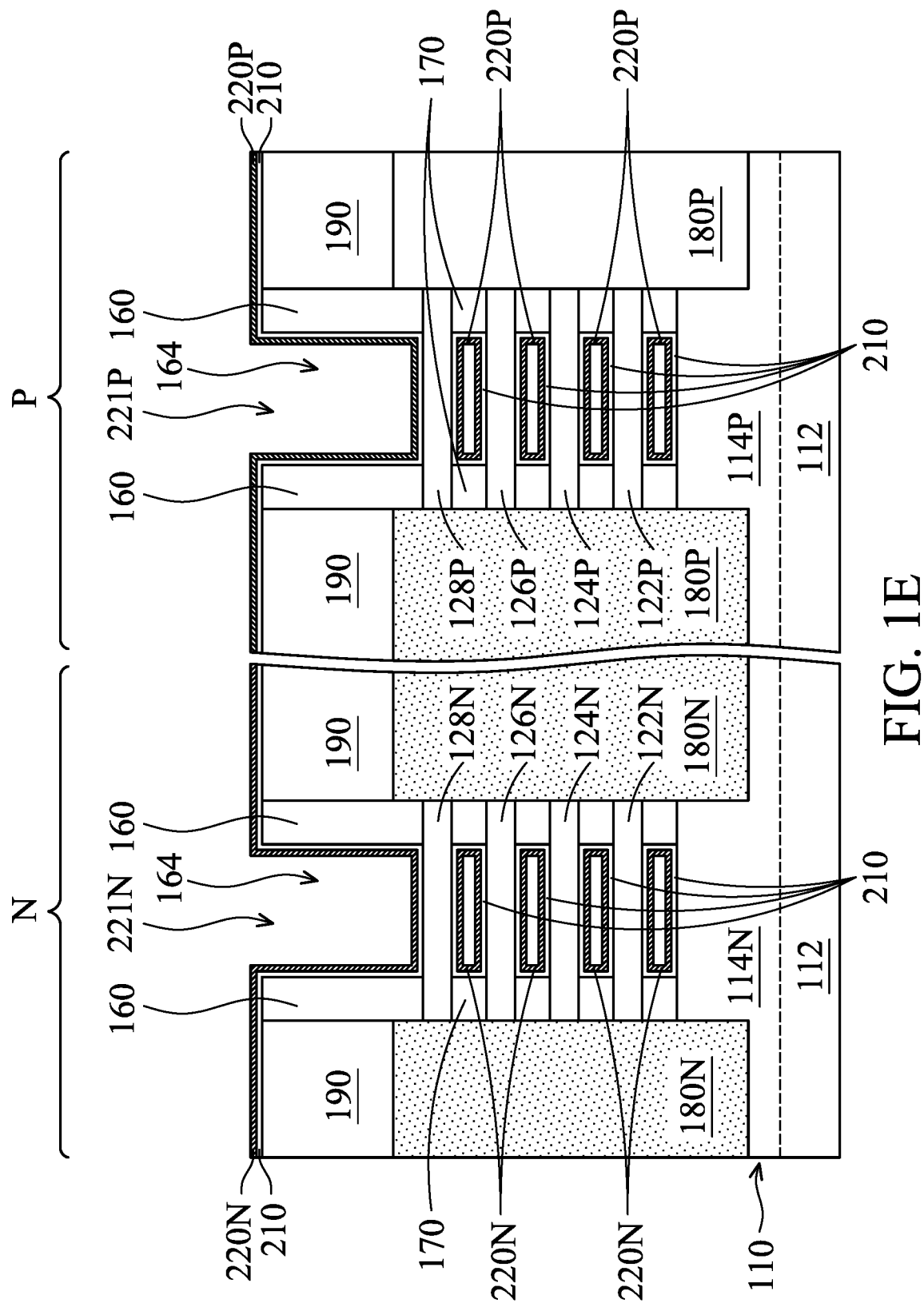

As shown in FIGS. 1D and 1E, the gate stacks 140N and 140P and the mask layer 150 are removed, in accordance with some embodiments. The removal process forms trenches 164 in the spacer structure 160, in accordance with some embodiments. As shown in FIGS. 1D and 1E, the nanostructures 121N, 121P, 123N, 123P, 125N, 125P, 127N and 127P are removed through the trenches 164, in accordance with some embodiments. The removal process for removing the gate stacks 140N and 140P, the mask layer 150 and the nanostructures 121N, 121P, 123N, 123P, 125N, 125P, 127N and 127P includes an etching process such as a wet etching process or a dry etching process, in accordance with some embodiments.

As shown in FIG. 1E, a gate dielectric layer 210 is formed over the nanostructures 122N, 122P, 124N, 124P, 126N, 126P, 128N and 128P, the spacer structure 160, the inner spacer layer 170 and the dielectric layer 190, in accordance with some embodiments. The gate dielectric layer 210 surrounds the nanostructures 122N, 122P, 124N, 124P, 126N, 126P, 128N and 128P, in accordance with some embodiments.

The gate dielectric layer 210 conformally covers the nanostructures 122N, 122P, 124N, 124P, 126N, 126P, 128N and 128P, the spacer structure 160, the inner spacer layer 170 and the dielectric layer 190, in accordance with some embodiments. The gate dielectric layer 210 is made of a high-K material, such as $HfO_2$, $La_2O_3$, $CaO$, $ZrO_2$, $HfZrO_2$, or $Al_2O_3$, in accordance with some embodiments. The gate dielectric layer 210 is formed using an atomic layer deposition process or another suitable process.

As shown in FIG. 1E, a work function metal layer 220N is conformally formed over the gate dielectric layer 210 in the N-region N, in accordance with some embodiments. The work function metal layer 220N provides a desired work function for transistors to enhance device performance including improved threshold voltage. In the embodiments of forming an NMOS transistor, the work function metal layer 220N can be a metal capable of providing a work function value suitable for the device, such as equal to or less than about 4.5 eV.

The work function metal layer 220N is made of metal, metal carbide, metal nitride, or a combination thereof, in accordance with some embodiments. For example, the work function metal layer 220N is made of tantalum, hafnium carbide, zirconium carbide, tantalum nitride, or a combination thereof.

The work function metal layer 220N is formed using a deposition process, a photolithography process, and an etching process, in accordance with some embodiments. The deposition process includes a physical vapor deposition process, a chemical vapor deposition process, an atomic layer deposition process, or a combination thereof, in accordance with some embodiments.

As shown in FIG. 1E, a work function metal layer 220P is conformally formed over the gate dielectric layer 210 in the P-region P, in accordance with some embodiments. The work function metal layer 220P provides a desired work function for transistors to enhance device performance including improved threshold voltage. In the embodiments of forming a PMOS transistor, the work function metal layer 220P can be a metal capable of providing a work function value suitable for the device, such as equal to or greater than about 4.8 eV.

The work function metal layer 220P is made of metal, metal carbide, metal nitride, another suitable material, or a combination thereof, in accordance with some embodiments. For example, the work function metal layer 220P is made of titanium, titanium nitride, another suitable material, or a combination thereof.

The work function metal layer 220P is formed using a deposition process, a photolithography process, and an etching process, in accordance with some embodiments. The deposition process includes a physical vapor deposition process, a chemical vapor deposition process, an atomic layer deposition process, or a combination thereof, in accordance with some embodiments.

Figure 1F:
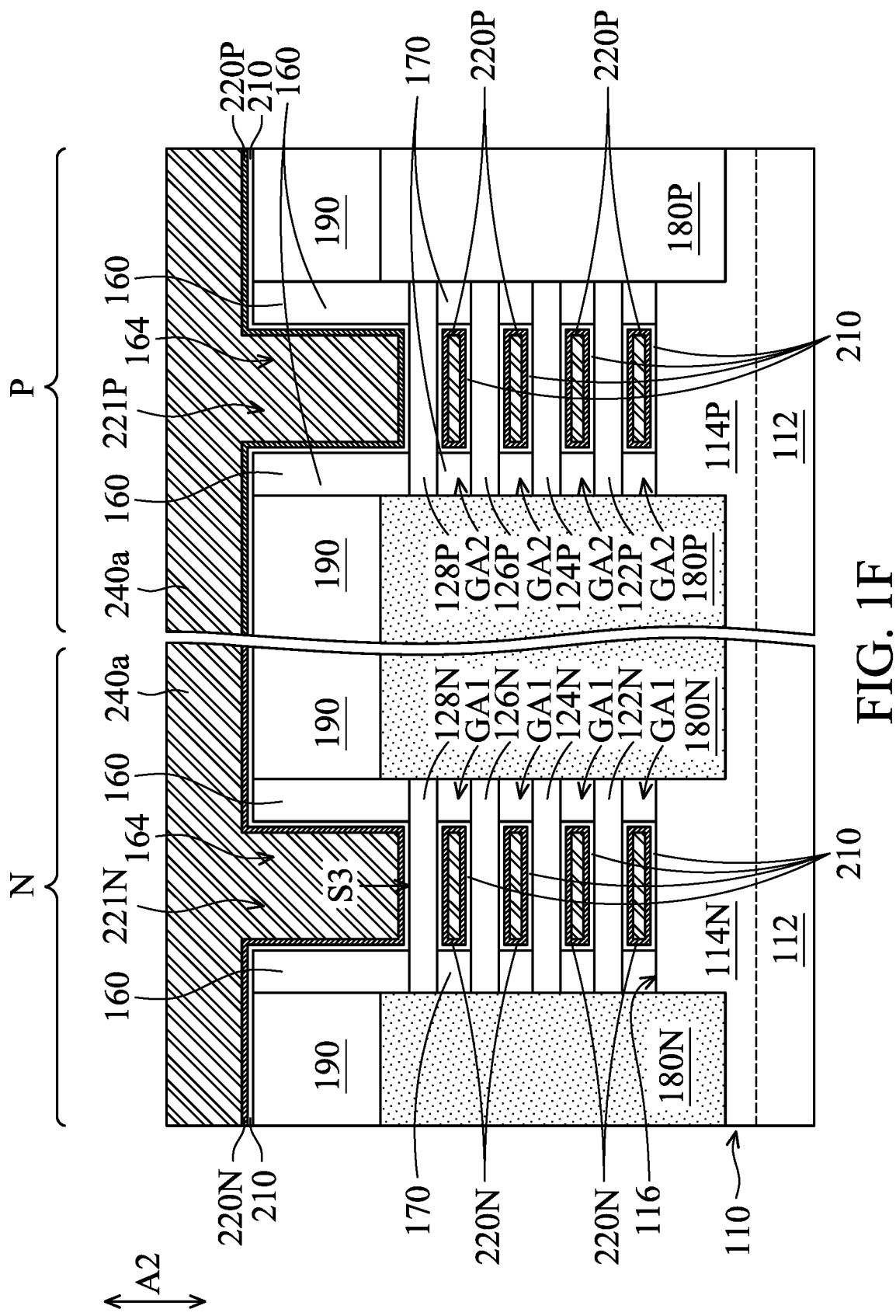

As shown in FIG. 1F, a compressive gate electrode material layer 240a is formed over the work function metal layers 220N and 220P, in accordance with some embodiments. The trenches 164 of the spacer structure 160 (or the recesses 221N and 221P of the work function metal layers 220N and 220P) and gaps GA1 between the fin 114N and the nanostructures 122N, 124N, 126N, and 128N and gaps GA2 between the fin 114P and the nanostructures 122P, 124P, 126P, and 128P are completely filled with the compressive gate electrode material layer 240a, in accordance with some embodiments.

The compressive gate electrode material layer 240a is made of metal, metal nitride, or metal carbide, in accordance with some embodiments. The compressive gate electrode material layer 240a is made of tungsten, titanium nitride, tantalum nitride, titanium aluminide, titanium carbide, or a combination thereof, in accordance with some embodiments. The compressive gate electrode material layer 240a is formed using an atomic layer deposition process or a chemical vapor deposition process, in accordance with some embodiments.

The compressive gate electrode material layer 240a formed by the atomic layer deposition process or the chemical vapor deposition process is able to provide a compressive stress S3 to the nanostructures 122N, 124N, 126N, and 128N so as to induce a compressive strain in the nanostructures 122N, 124N, 126N and 128N, in accordance with some embodiments. The compressive strain is along an axis A2 perpendicular to a top surface 116 of the substrate 110, in accordance with some embodiments.

Figure 1G:
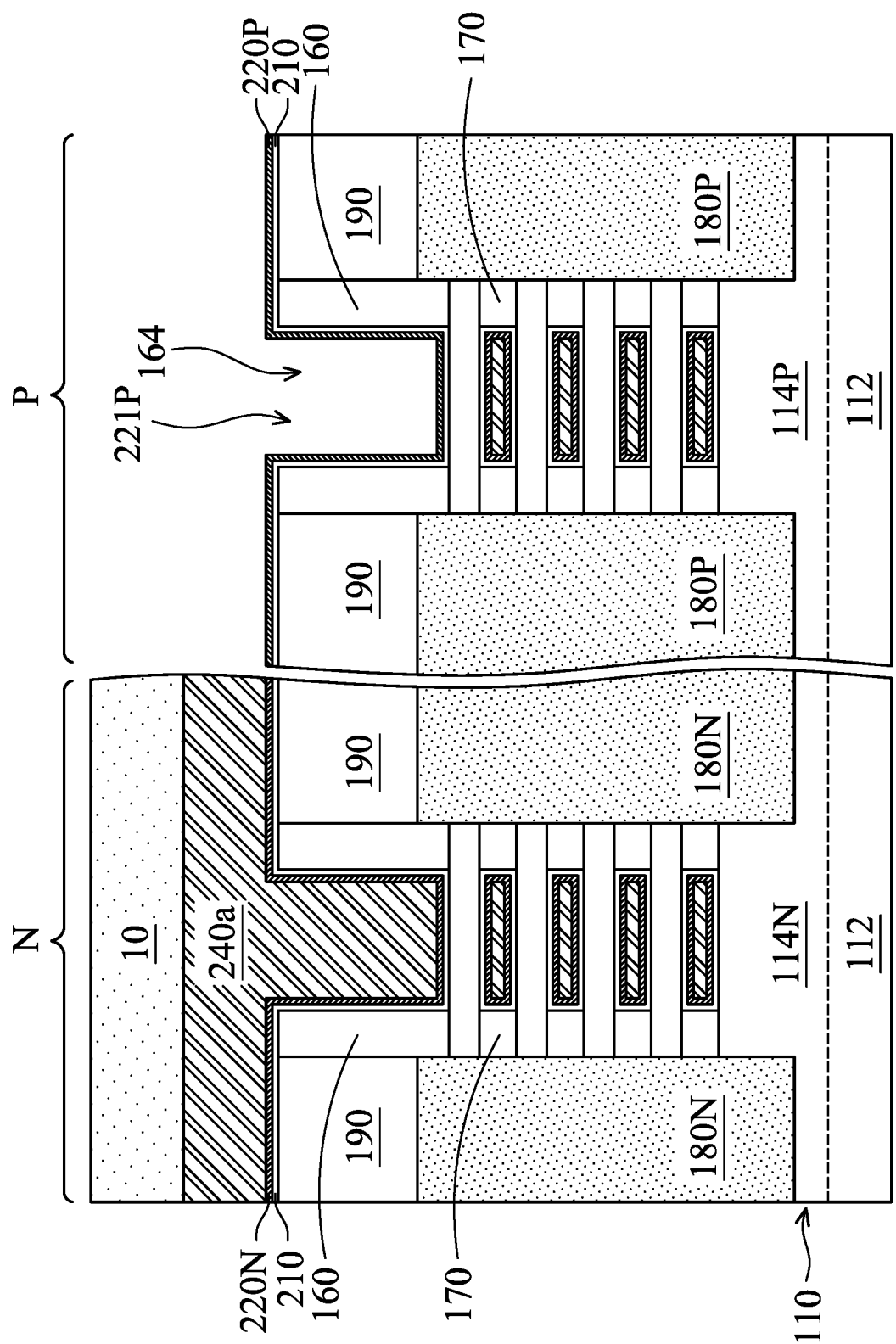

As shown in FIG. 1G, a mask layer 10 is formed over the compressive gate electrode material layer 240a in the N-region N, in accordance with some embodiments. The mask layer 10 is made of a material different from the compressive gate electrode material layer 240a, in accordance with some embodiments. The material includes a polymer material such as a photoresist material, in accordance with some embodiments.

As shown in FIG. 1G, the compressive gate electrode material layer 240a, which is not covered by the mask layer 10, is removed, in accordance with some embodiments. The removal process includes an etching process, in accordance with some embodiments.

Figure 1H:
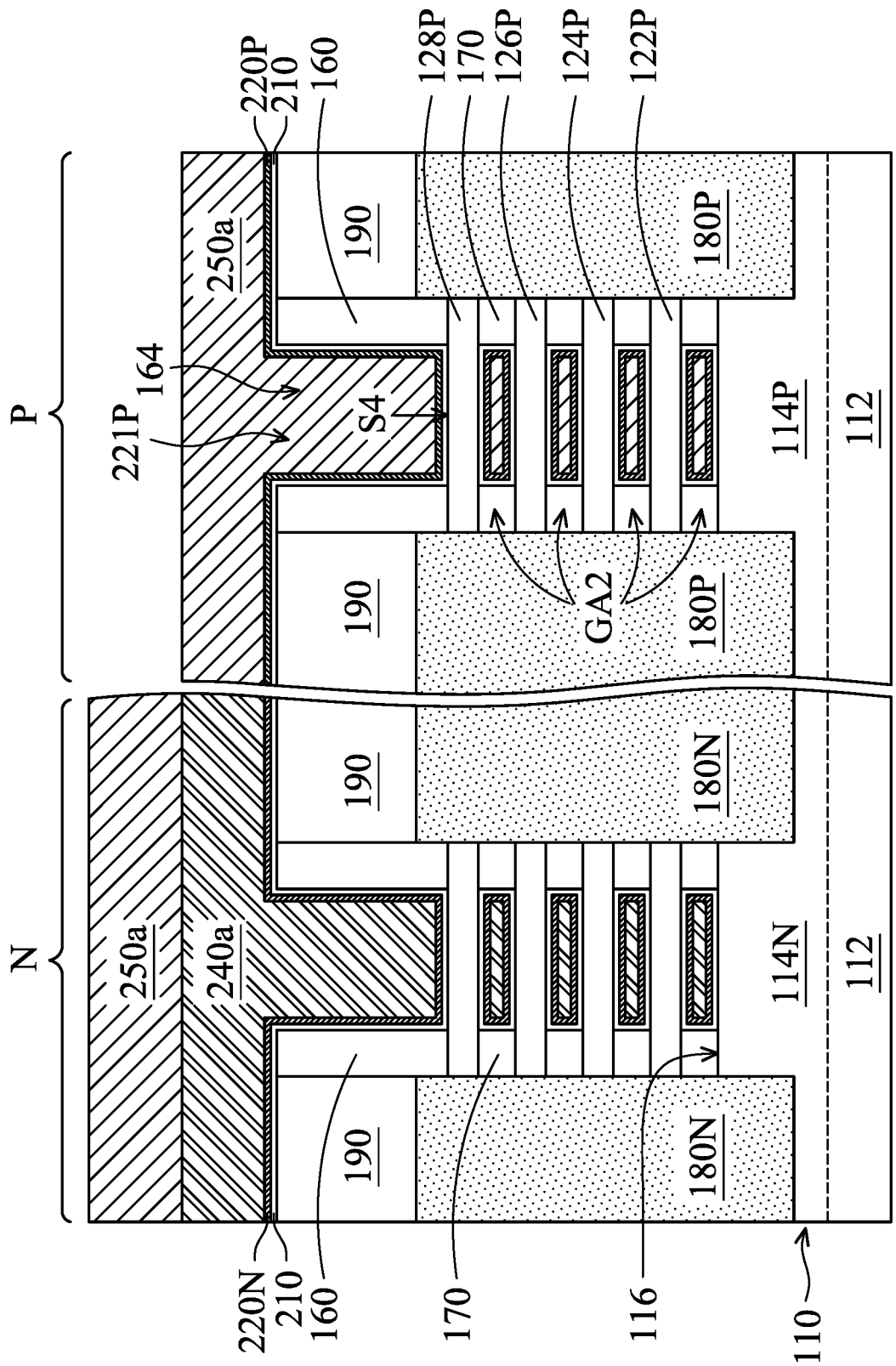

As shown in FIG. 1H, the mask layer 10 is removed, in accordance with some embodiments. As shown in FIG. 1H, a tensile gate electrode material layer 250a is formed over the work function metal layer 220P and the compressive gate electrode material layer 240a, in accordance with some embodiments. The trench 164 of the spacer structure 160 (or the recess 221P of the work function metal layer 220P) and the gaps GA2 between the fin 114P and the nanostructures 122P, 124P, 126P, and 128P are completely filled with the tensile gate electrode material layer 250a, in accordance with some embodiments.

The compressive gate electrode material layer 240a and the tensile gate electrode material layer 250a are made of different materials, in accordance with some embodiments. The tensile gate electrode material layer 250a is made of metal nitride (e.g., titanium nitride or tantalum nitride) or metal carbide (e.g., titanium-aluminum carbide or titanium carbide), in accordance with some embodiments. The tensile gate electrode material layer 250a is formed using a physical vapor deposition process, in accordance with some embodiments.

When the tensile gate electrode material layer 250a is made of metal nitride (e.g., titanium nitride or tantalum nitride) or metal carbide (e.g., titanium-aluminum carbide or titanium carbide) and is formed using a physical vapor deposition process, the tensile gate electrode material layer 250a is able to provide a tensile stress S4 to the nanostructures 122P, 124P, 126P and 128P so as to induce a tensile strain in the nanostructures 122P, 124P, 126P and 128P, in accordance with some embodiments. The tensile strain is along the axis A2 perpendicular to the top surface 116 of the substrate 110, in accordance with some embodiments.

The tensile gate electrode material layer 250a is made of metal nitride (e.g., titanium nitride) or metal (e.g., ruthenium), in accordance with some embodiments. The tensile gate electrode material layer 250a is formed using an atomic layer deposition process, in accordance with some embodiments.

When the tensile gate electrode material layer 250a is made of metal nitride (e.g., titanium nitride) or metal (e.g., ruthenium) and is formed using an atomic layer deposition process, the tensile gate electrode material layer 250a is able to provide the tensile stress S4 to the nanostructures 122P, 124P, 126P and 128P so as to induce the tensile strain in the nanostructures 122P, 124P, 126P and 128P, in accordance with some embodiments.

Figure 1I:
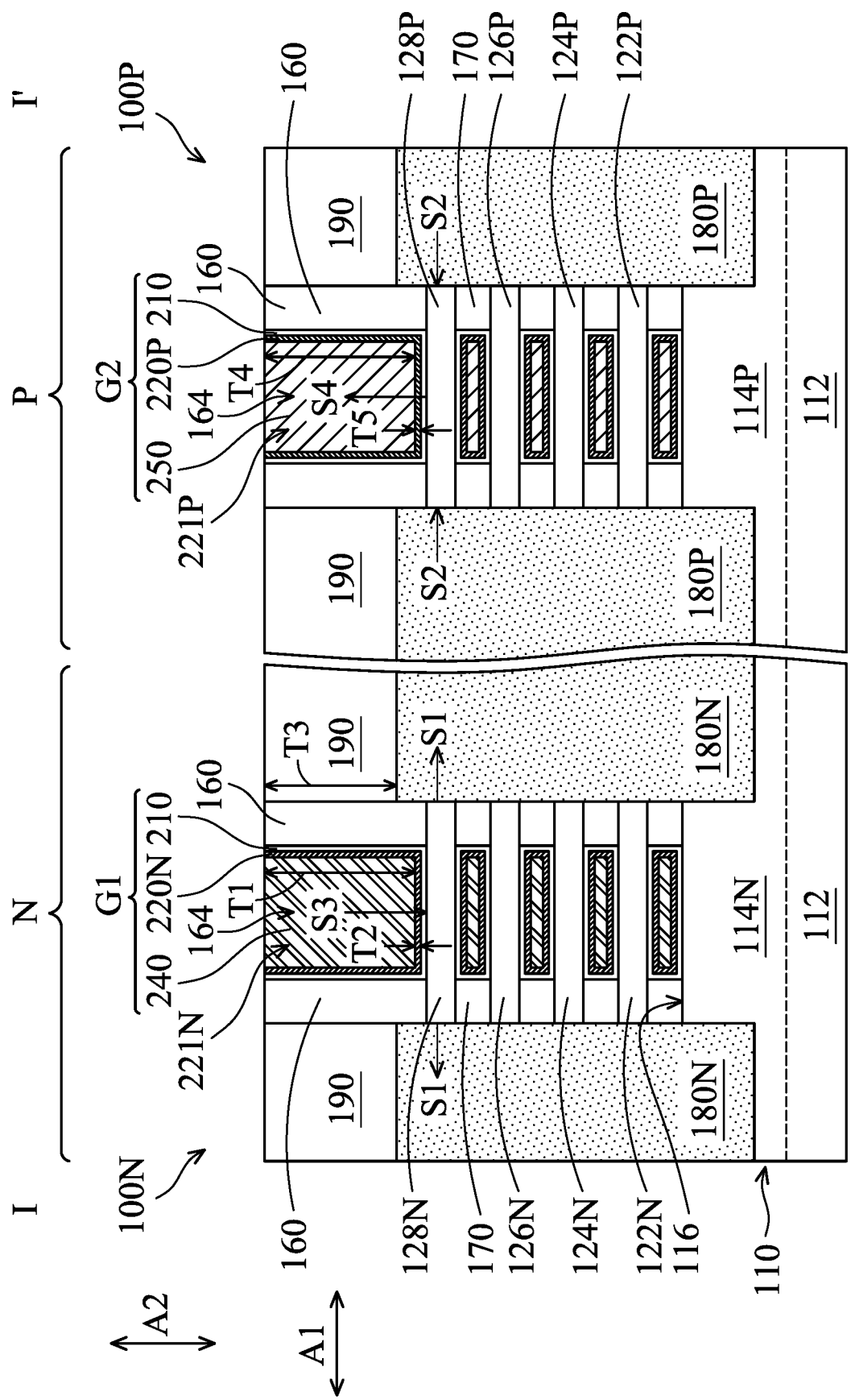
Figures 1, 1I:
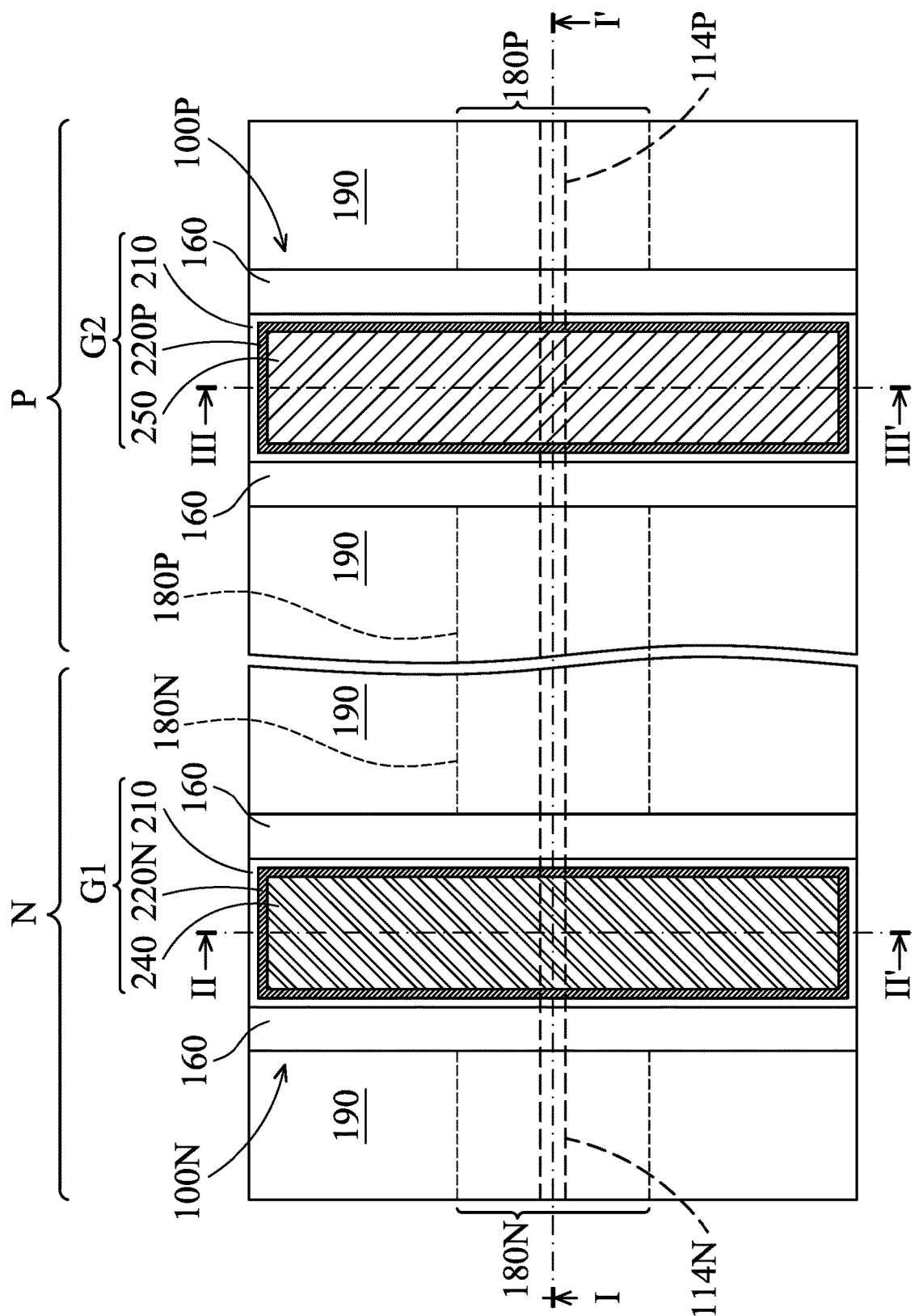
Figures 1, 1I, 2:
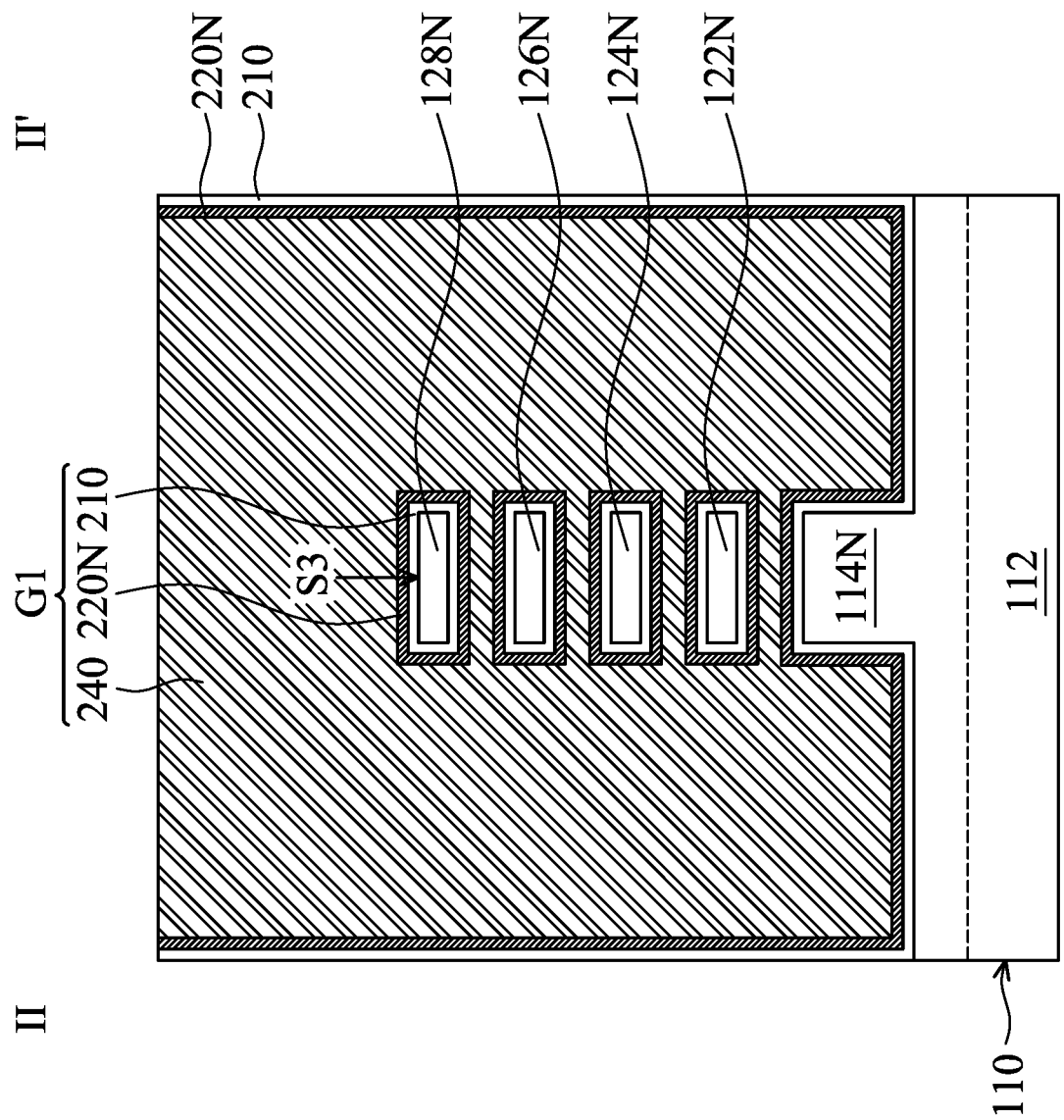
Figures 1, 1I, 2, 3:
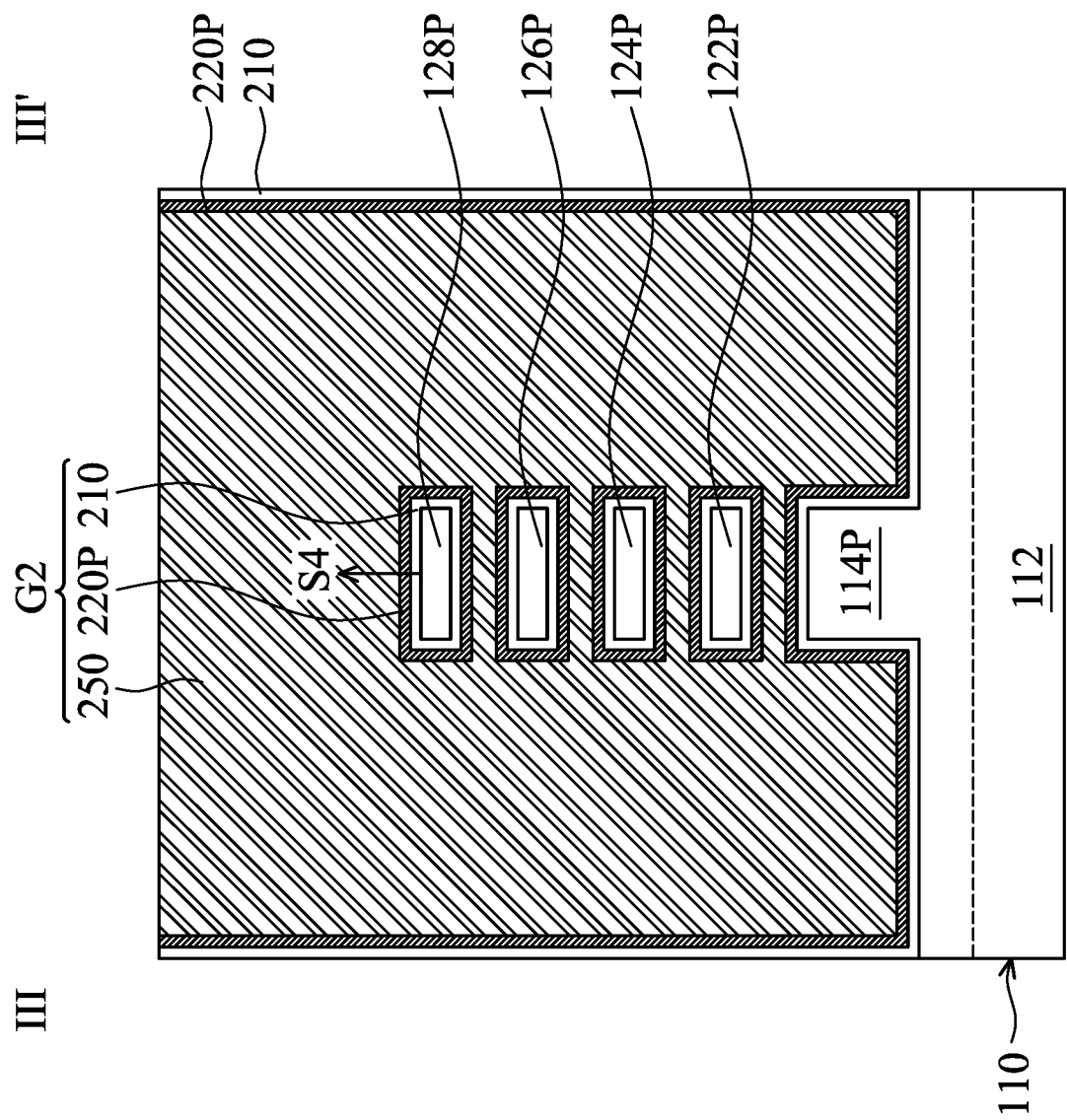

FIG. 1I-1 is a top view of the semiconductor device structure of FIG. 1I, in accordance with some embodiments. FIG. 1I is a cross-sectional view illustrating the semiconductor device structure along a sectional line I-I' in FIG. 1I-1, in accordance with some embodiments. FIG. 1I-2 is a cross-sectional view illustrating the semiconductor device structure along a sectional line II-II' in FIG. 1I-1, in accordance with some embodiments. FIG. 1I-3 is a cross-sectional view illustrating the semiconductor device structure along a sectional line III-III' in FIG. 1I-1, in accordance with some embodiments.

As shown in FIGS. 1I, 1I-1, 1I-2, and 1I-3, the compressive gate electrode material layer 240a and the tensile gate electrode material layer 250a outside of the trenches 164 are removed, in accordance with some embodiments. The compressive gate electrode material layer 240a remaining in the trench 164 forms a compressive gate electrode layer 240, in accordance with some embodiments.

The compressive gate electrode layer 240 surrounds the nanostructures 122N, 124N, 126N, and 128N, in accordance with some embodiments. The compressive gate electrode layer 240, the work function metal layer 220N, and the gate dielectric layer 210 thereunder together form a gate stack G1, in accordance with some embodiments.

The tensile gate electrode material layer 250a remaining in the trench 164 forms a tensile gate electrode layer 250, in accordance with some embodiments. The tensile gate electrode layer 250 surrounds the nanostructures 122P, 124P, 126P, and 128P, in accordance with some embodiments. The tensile gate electrode layer 250, the work function metal layer 220P, and the gate dielectric layer 210 thereunder together form a gate stack G2, in accordance with some embodiments. The removal process includes a planarization process such as a chemical mechanical polishing process, in accordance with some embodiments.

The compressive gate electrode layer 240 is thicker than the work function metal layer 220N, in accordance with some embodiments. That is, a thickness T1 of the compressive gate electrode layer 240 is greater than a thickness T2 of the work function metal layer 220N, in accordance with some embodiments.

The compressive gate electrode layer 240 is thicker than the dielectric layer 190, in accordance with some embodiments. That is, the thickness T1 of the compressive gate electrode layer 240 is greater than a thickness T3 of the dielectric layer 190, in accordance with some embodiments. The thickness T1 ranges from about 1 nm to about 5 nm, in accordance with some embodiments.

The tensile gate electrode layer 250 is thicker than the work function metal layer 220P, in accordance with some embodiments. That is, a thickness T4 of the tensile gate electrode layer 250 is greater than a thickness T5 of the work function metal layer 220P, in accordance with some embodiments.

The tensile gate electrode layer 250 is thicker than the dielectric layer 190, in accordance with some embodiments. That is, the thickness T4 of the tensile gate electrode layer 250 is greater than the thickness T3 of the dielectric layer 190, in accordance with some embodiments. The thickness T4 ranges from about 1 nm to about 5 nm, in accordance with some embodiments.

In this step, an NMOS transistor 100N and a PMOS transistor 100P are substantially formed, in accordance with some embodiments. The NMOS transistor 100N includes the gate stack G1, the nanostructures 122N, 124N, 126N, and 128N, and the tensile epitaxial structures 180N, in accordance with some embodiments. The PMOS transistor 100P includes the gate stack G2, the nanostructures 122P, 124P, 126P and 128P, and the compressive epitaxial structures 180P, in accordance with some embodiments.

The compressive gate electrode layer 240 provide the compressive stress S3 to the nanostructures 122N, 124N, 126N, and 128N so as to induce the compressive strain in the nanostructures 122N, 124N, 126N and 128N along the axis A2, in accordance with some embodiments. The tensile epitaxial structures 180N provide the tensile stress S1 to the nanostructures 122N, 124N, 126N and 128N so as to induce a tensile strain in the nanostructures 122N, 124N, 126N and 128N along the longitudinal axis A1 of the nanostructures 122N, 124N, 126N and 128N, in accordance with some embodiments.

The compressive strain along the axis A2 and the tensile strain along the longitudinal axis A1 improve the carrier mobility of the nanostructures 122N, 124N, 126N and 128N (i.e. channel structures) and therefore improve the performance of the NMOS transistor 100N, in accordance with some embodiments.

The tensile gate electrode layer 250 provides the tensile stress S4 to the nanostructures 122P, 124P, 126P and 128P so as to induce a tensile strain in the nanostructures 122P, 124P, 126P and 128P along the axis A2, in accordance with some embodiments. The compressive epitaxial structures 180P provides the compressive stress S2 to the nanostructures 122P, 124P, 126P and 128P (i.e. channel structures) so as to induce the compressive strain in the nanostructures 122P, 124P, 126P and 128P along the longitudinal axis A1 of the nanostructures 122P, 124P, 126P and 128P (or the nanostructures 122N, 124N, 126N and 128N), in accordance with some embodiments.

The tensile strain along the axis A2 and the compressive strain along the longitudinal axis A1 improve the carrier mobility of the nanostructures 122P, 124P, 126P and 128P (i.e. channel structures) and therefore improve the performance of the PMOS transistor 100P, in accordance with some embodiments.

Figure 1J:
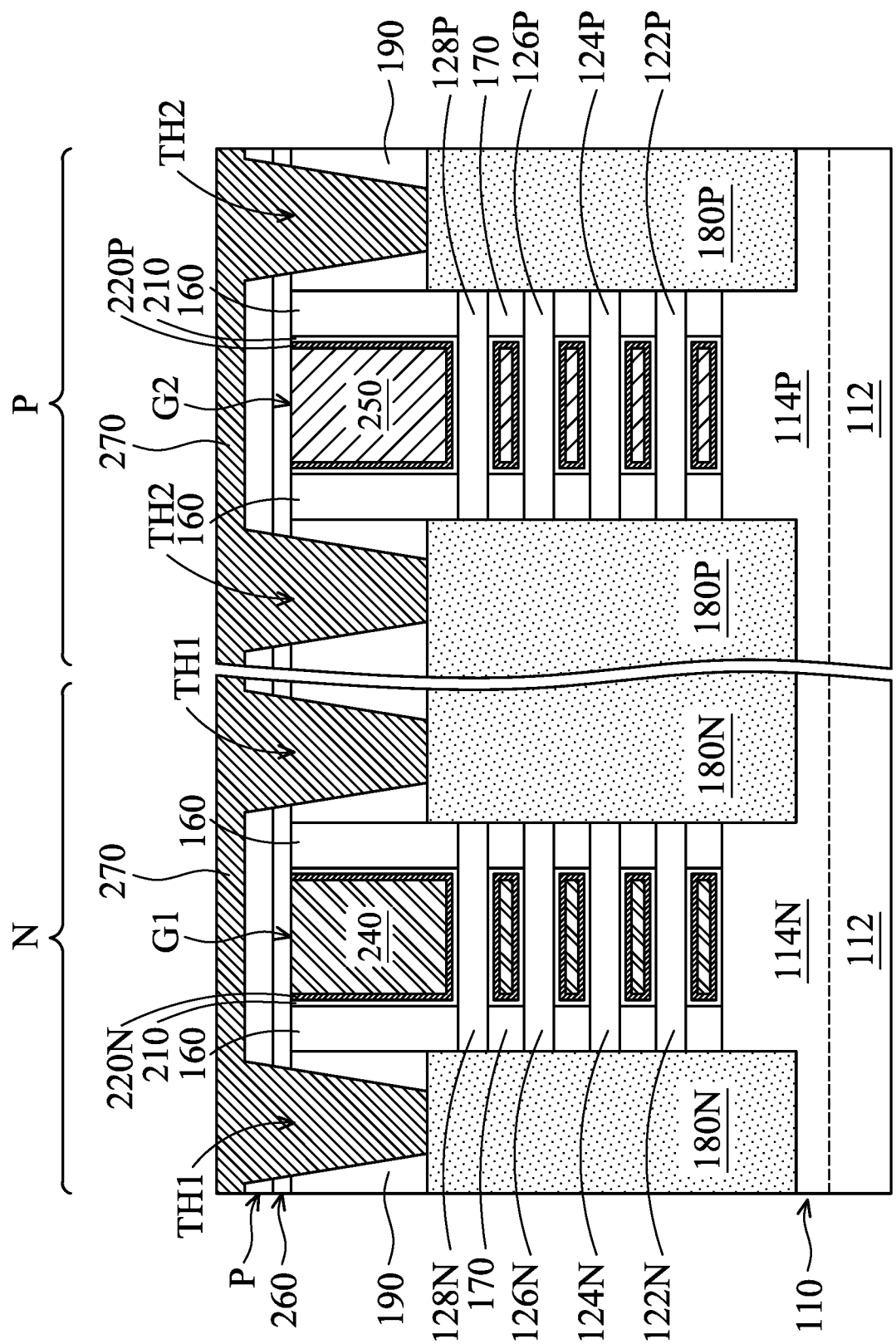

As shown in FIG. 1J, an etching stop layer 260 (also called an insulating layer or a dielectric layer) is deposited over the top surfaces of the dielectric layer 190, the spacer structure 160, and the gate stacks G1 and G2, in accordance with some embodiments. The etching stop layer 260 is made of silicon nitride, in accordance with some embodiments. As shown in FIG. 1J, a protective layer P is formed over the etching stop layer 260, in accordance with some embodiments. The protective layer P includes a plasma-enhanced oxide (PEOX) layer, in accordance with some embodiments.

As shown in FIG. 1J, portions of the protective layer P, the etching stop layer 260, and the dielectric layer 190 are removed to form through holes TH1 and TH2, in accordance with some embodiments. The through holes TH1 and TH2 pass through the protective layer P, the etching stop layer 260, and the dielectric layer 190 to expose the tensile epitaxial structures 180N and the compressive epitaxial structures 180P respectively, in accordance with some embodiments. The removal process includes performing a photolithography process and an etching process, in accordance with some embodiments.

As shown in FIG. 1J, a contact material layer 270 is deposited over the protective layer P and is filled into the through holes TH1 and TH2 to electrically contact with the tensile epitaxial structures 180N and the compressive epitaxial structures 180P, in accordance with some embodiments. The contact material layer 270 is formed by, for example, a PVD process or another suitable process. The contact material layer 270 is made of, for example, tungsten or another suitable conductive material.

Figure 1K:
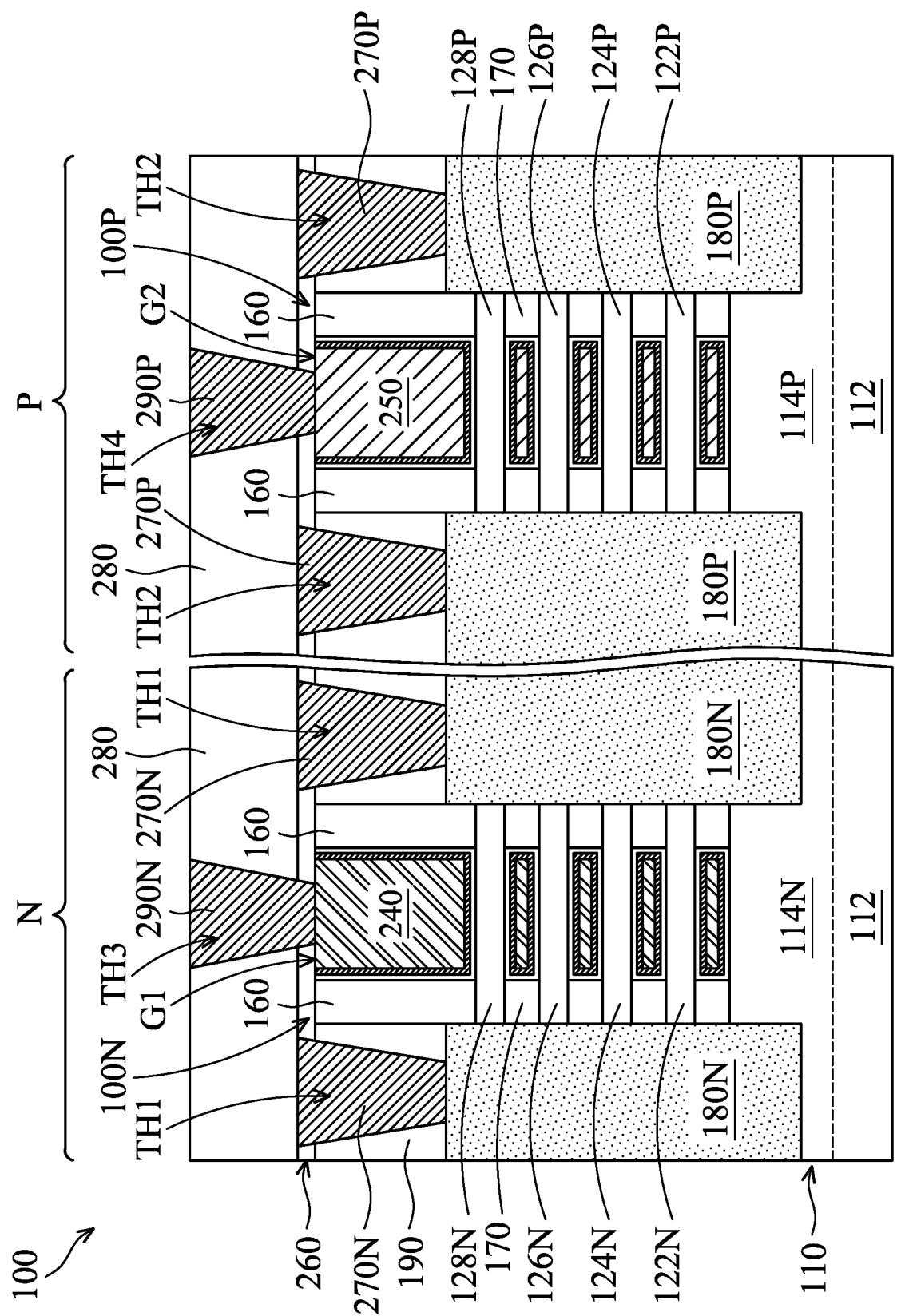

As shown in FIG. 1K, a planarization process is performed to remove the contact material layer 270 outside the through holes TH1 and TH2 and the protective layer P, in accordance with some embodiments. In this step, a semiconductor device structure 100 is substantially formed, in accordance with some embodiments. The planarization process includes a chemical mechanical polishing (CMP) process, in accordance with some embodiments.

After the CMP process, the contact material layer 270 remaining in the through holes TH1 forms contact structures 270N, in accordance with some embodiments. The contact structures 270N are electrically connected to the tensile epitaxial structures 180N respectively, in accordance with some embodiments. The contact structures 270N include contact plugs, in accordance with some embodiments.

After the CMP process, the contact material layer 270 remaining in the through holes TH2 forms contact structures 270P, in accordance with some embodiments. The contact structures 270P are electrically connected to the compressive epitaxial structures 180P respectively, in accordance with some embodiments. The contact structures 270P include contact plugs, in accordance with some embodiments.

As shown in FIG. 1K, a dielectric layer 280 is deposited over the etching stop layer 260 and the contact structures 270N and 270P, in accordance with some embodiments. The dielectric layer 280 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 280 is deposited using a CVD process, a HDPCVD process, a spin-on process, a sputtering process, or a combination thereof, in accordance with some embodiments.

As shown in FIG. 1K, portions of the etching stop layer 260 and the dielectric layer 280 are removed, in accordance with some embodiments. The removal process forms through holes TH3 and TH4 in the etching stop layer 260 and the dielectric layer 280, in accordance with some embodiments. The through hole TH3 exposes the compressive gate electrode layer 240 of the gate stack G1, in accordance with some embodiments. The through hole TH4 exposes the tensile gate electrode layer 250 of the gate stack G2, in accordance with some embodiments.

As shown in FIG. 1K, contact structures 290N and 290P are formed in the through holes TH3 and TH4 respectively, in accordance with some embodiments. The contact structures 290N and 290P are electrically connected to the compressive gate electrode layer 240 and the tensile gate electrode layer 250 respectively, in accordance with some embodiments.

The contact structure 290N is in direct contact with the compressive gate electrode layer 240, in accordance with some embodiments. The contact structure 290P is in direct contact with the tensile gate electrode layer 250, in accordance with some embodiments. The contact structures 290N and 290P are made of, for example, tungsten or another suitable conductive material.

Figure 2A:
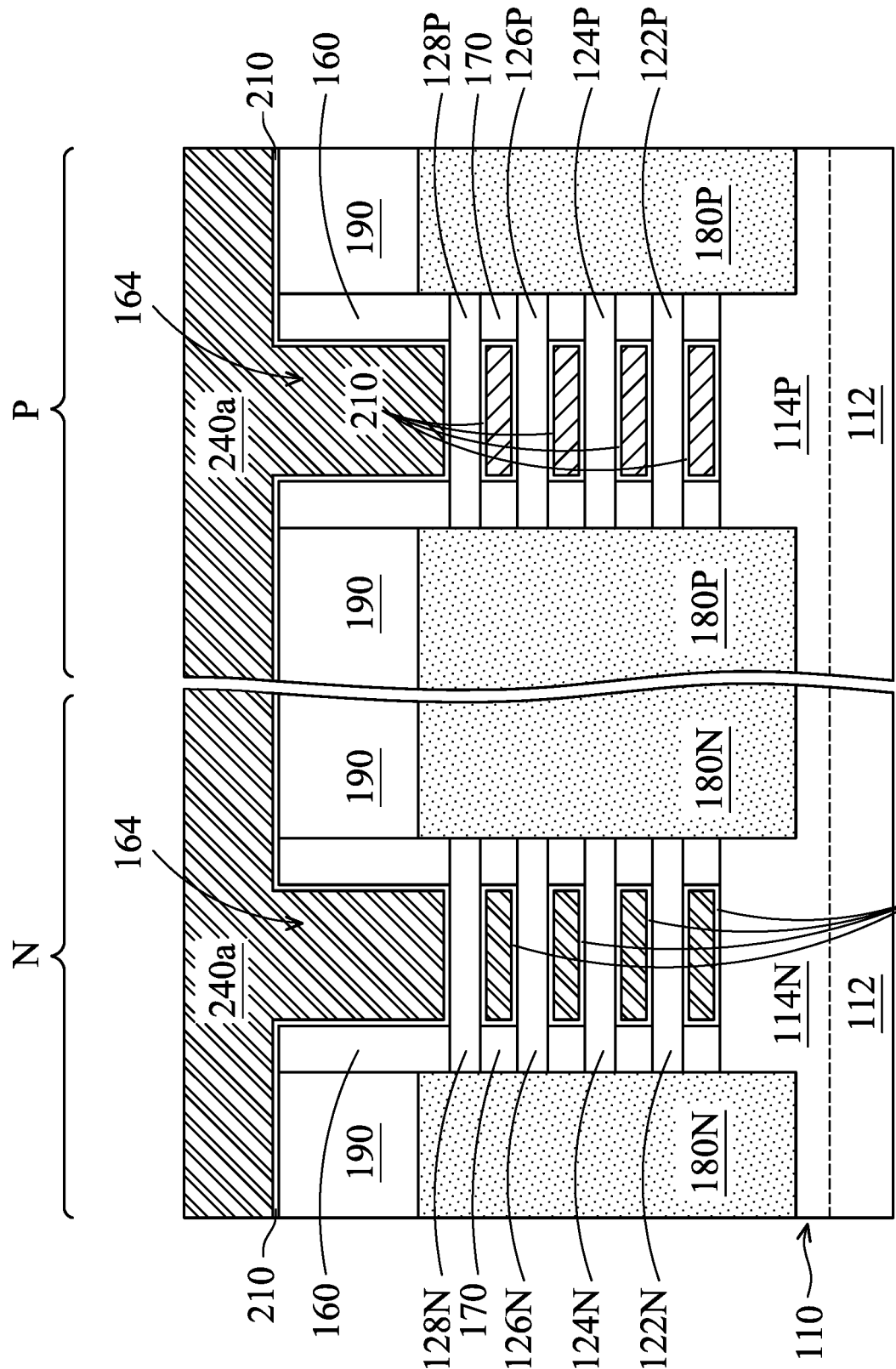
FIGS. 2A-2E are cross-sectional views of various stages of a process for forming a semiconductor device structure, in accordance with some embodiments.

FIGS. 2A-2E are cross-sectional views of various stages of a process for forming a semiconductor device structure, in accordance with some embodiments. After the step of forming the gate dielectric layer 210 of FIG. 1E, as shown in FIG. 2A, a compressive gate electrode material layer 240a is formed over the gate dielectric layer 210, in accordance with some embodiments. The compressive gate electrode material layer 240a is in direct contact with the gate dielectric layer 210, in accordance with some embodiments.

Figure 2B:
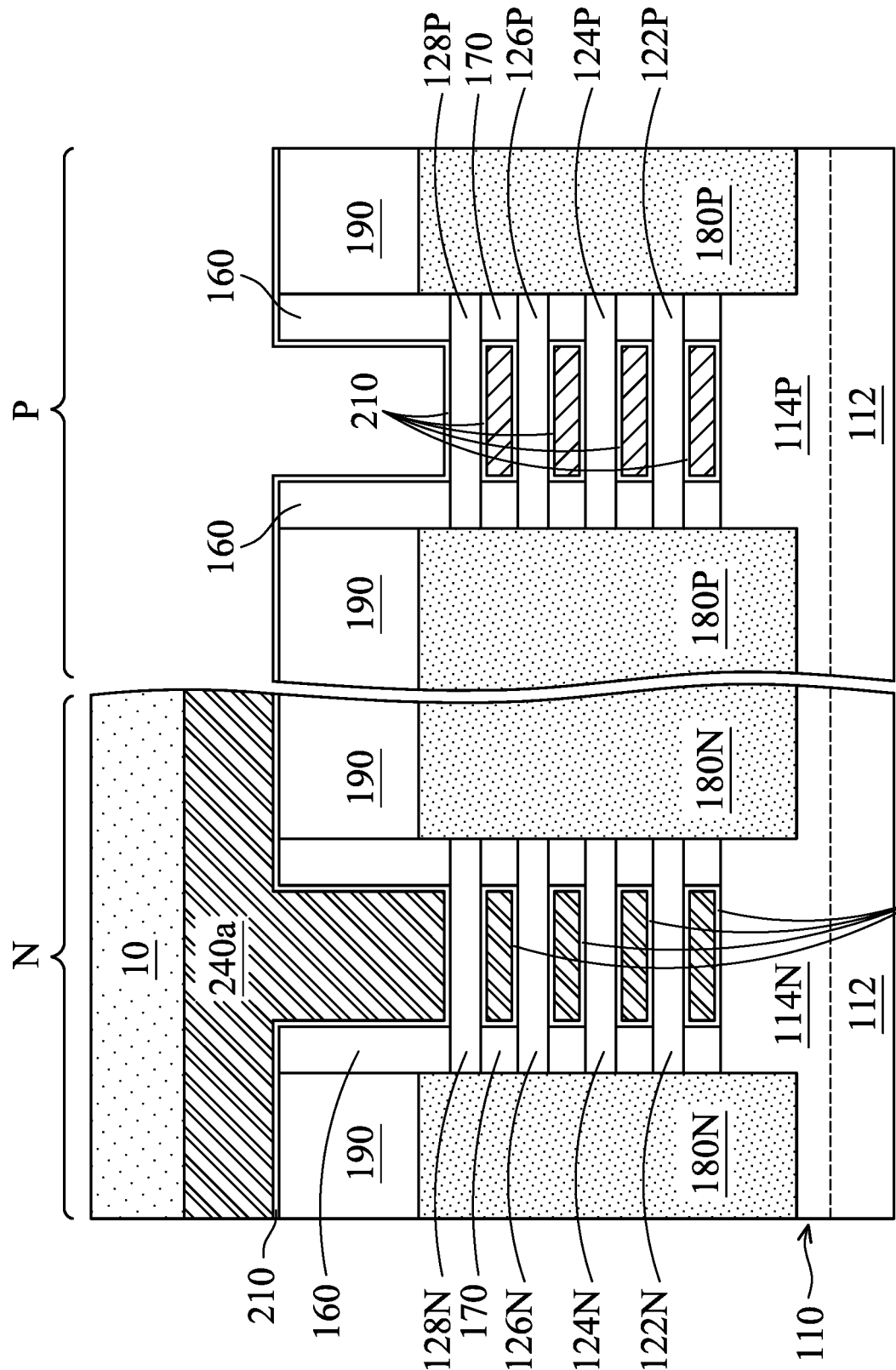

As shown in FIG. 2B, a mask layer 10 is formed over the compressive gate electrode material layer 240a in the N-region N, in accordance with some embodiments. As shown in FIG. 2B, the compressive gate electrode material layer 240a, which is not covered by the mask layer 10, is removed, in accordance with some embodiments. The removal process includes an etching process, in accordance with some embodiments.

Figure 2C:
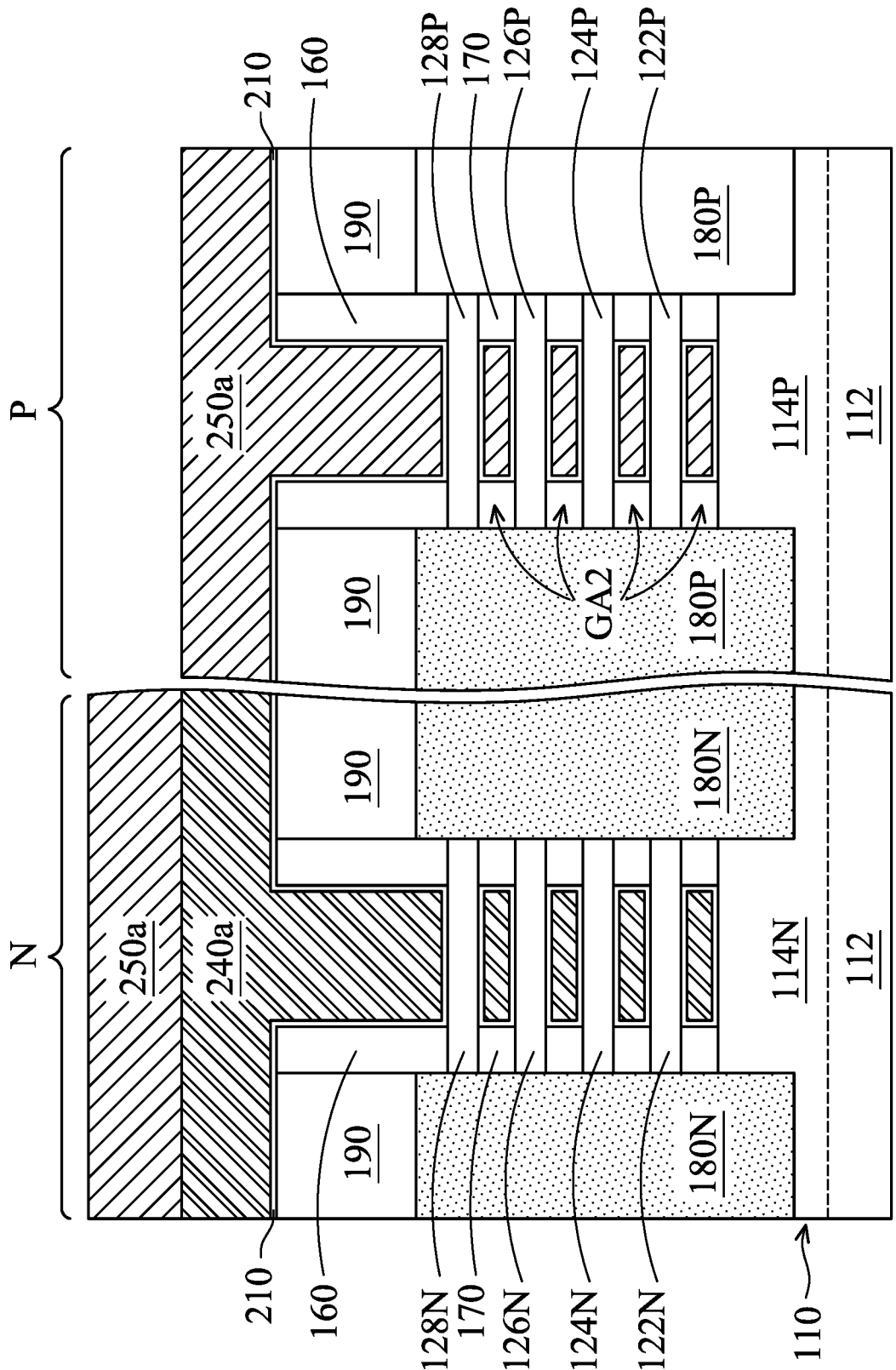

As shown in FIG. 2C, the mask layer 10 is removed, in accordance with some embodiments. As shown in FIG. 2C, a tensile gate electrode material layer 250a is formed over the gate dielectric layer 210 and the compressive gate electrode material layer 240a, in accordance with some embodiments. The trench 164 of the spacer structure 160 and the gaps GA2 between the fin 114P and the nanostructures 122P, 124P, 126P, and 128P are completely filled with the tensile gate electrode material layer 250a, in accordance with some embodiments.

The compressive gate electrode material layer 240a and the tensile gate electrode material layer 250a are made of different materials, in accordance with some embodiments. The tensile gate electrode material layer 250a is made of metal nitride (e.g., titanium nitride or tantalum nitride) or metal carbide (e.g., titanium-aluminum carbide or titanium carbide), in accordance with some embodiments. The tensile gate electrode material layer 250a is formed using a physical vapor deposition process, in accordance with some embodiments.

Figure 2D:
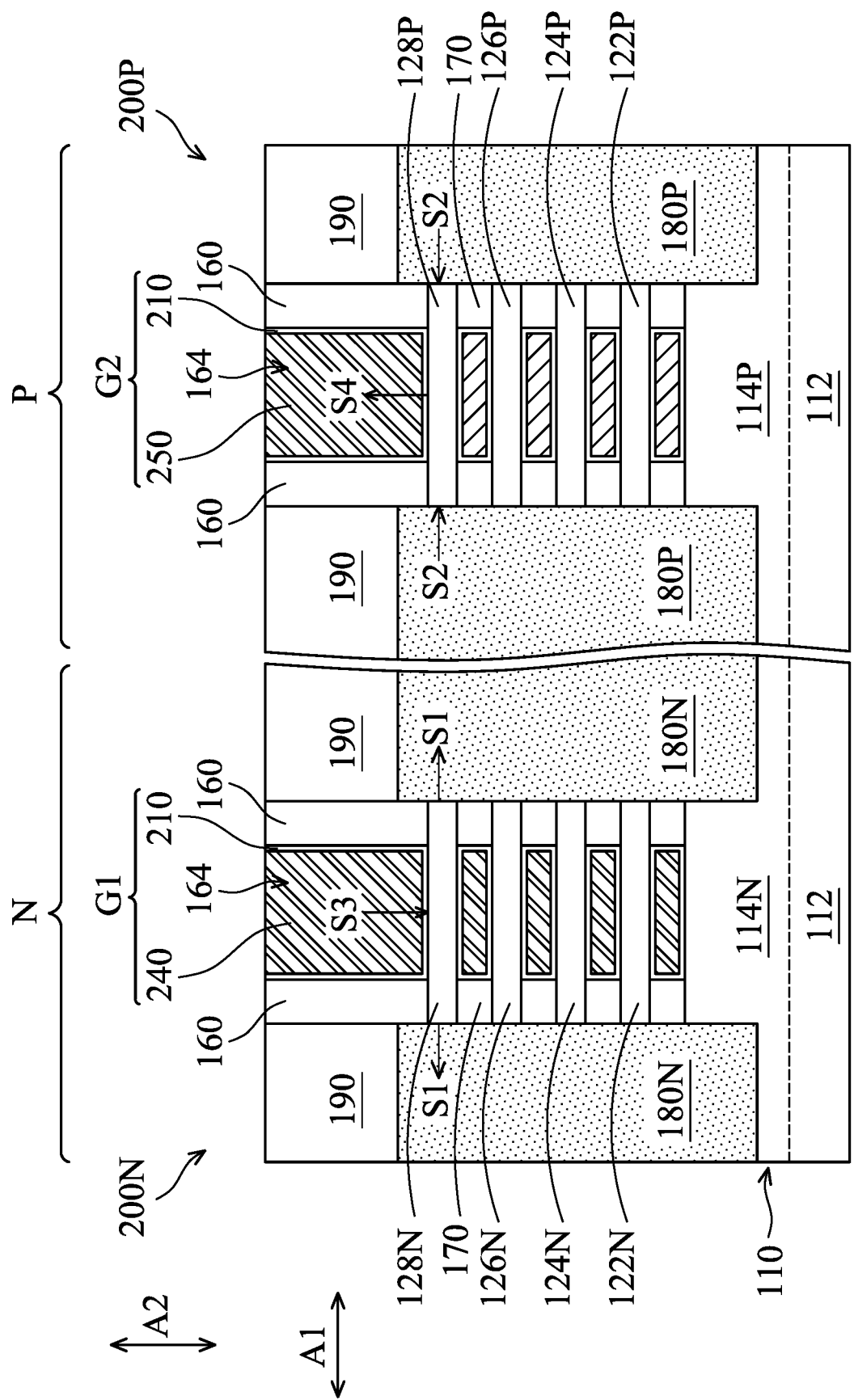

As shown in FIG. 2D, the compressive gate electrode material layer 240a and the tensile gate electrode material layer 250a outside of the trenches 164 are removed, in accordance with some embodiments. The compressive gate electrode material layer 240a remaining in the trench 164 forms a compressive gate electrode layer 240, in accordance with some embodiments.

The compressive gate electrode layer 240 surrounds the nanostructures 122N, 124N, 126N, and 128N, in accordance with some embodiments. The compressive gate electrode layer 240 and the gate dielectric layer 210 thereunder together form a gate stack G1, in accordance with some embodiments.

The tensile gate electrode material layer 250a remaining in the trench 164 forms a tensile gate electrode layer 250, in accordance with some embodiments. The tensile gate electrode layer 250 surrounds the nanostructures 122P, 124P, 126P, and 128P, in accordance with some embodiments. The tensile gate electrode layer 250 and the gate dielectric layer 210 thereunder together form a gate stack G2, in accordance with some embodiments. The gate stack G2 fills the trench 164, in accordance with some embodiments. The removal process includes a planarization process such as a chemical mechanical polishing process, in accordance with some embodiments.

In this step, an NMOS transistor 200N and a PMOS transistor 200P are substantially formed, in accordance with some embodiments. The NMOS transistor 200N includes the gate stack G1, the nanostructures 122N, 124N, 126N, and 128N, and the tensile epitaxial structures 180N, in accordance with some embodiments. The PMOS transistor 200P includes the gate stack G2, the nanostructures 122P, 124P, 126P and 128P, and the compressive epitaxial structures 180P, in accordance with some embodiments.

Figure 2E:
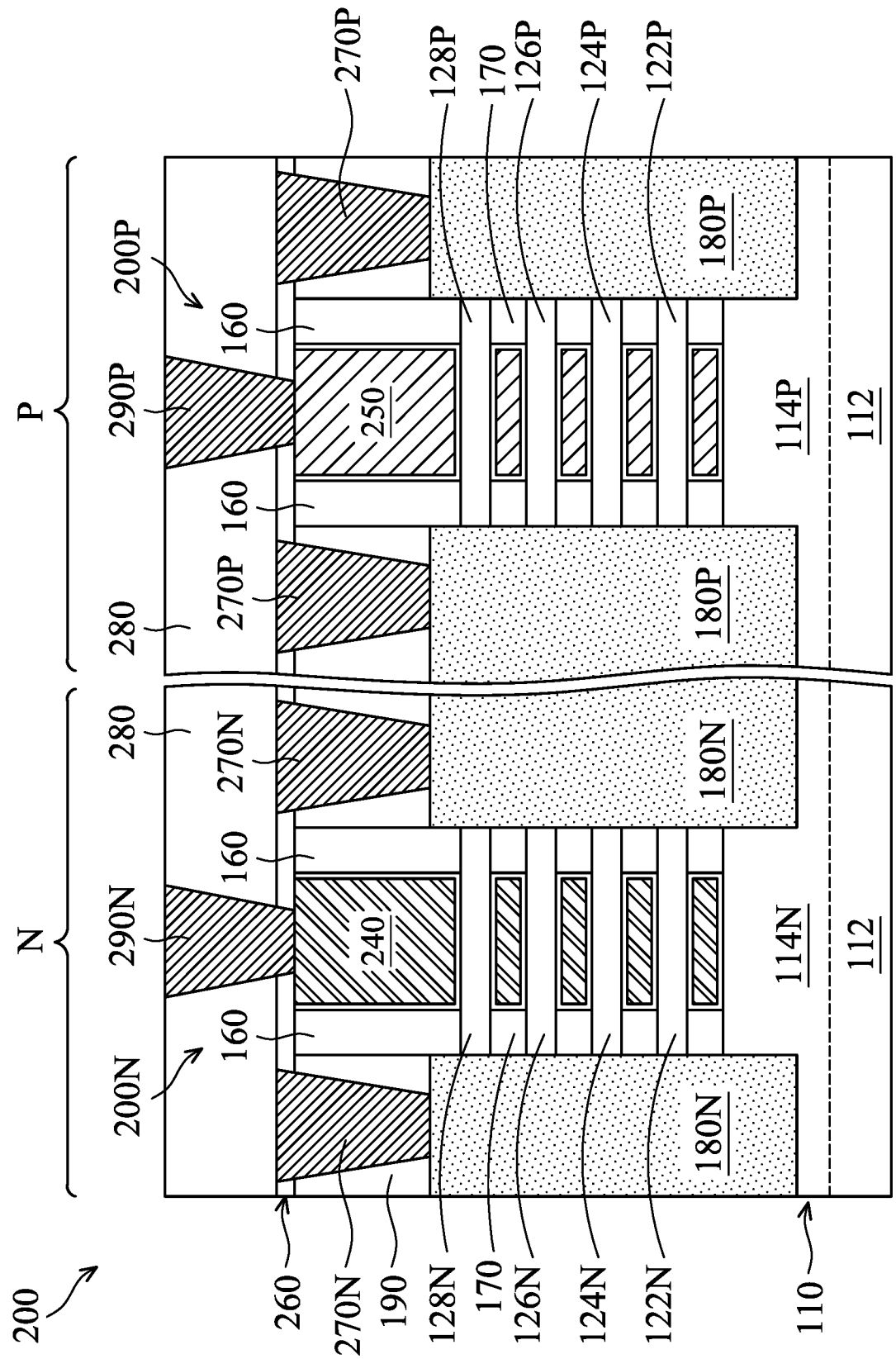

After performing the steps of FIGS. 1J-1K, as shown in FIG. 2E, an etching stop layer 260, contact structures 270N and 270P, a dielectric layer 280, and contact structures 290N and 290P are formed, in accordance with some embodiments. In this step, a semiconductor device structure 200 is substantially formed, in accordance with some embodiments.

Figure 3A:
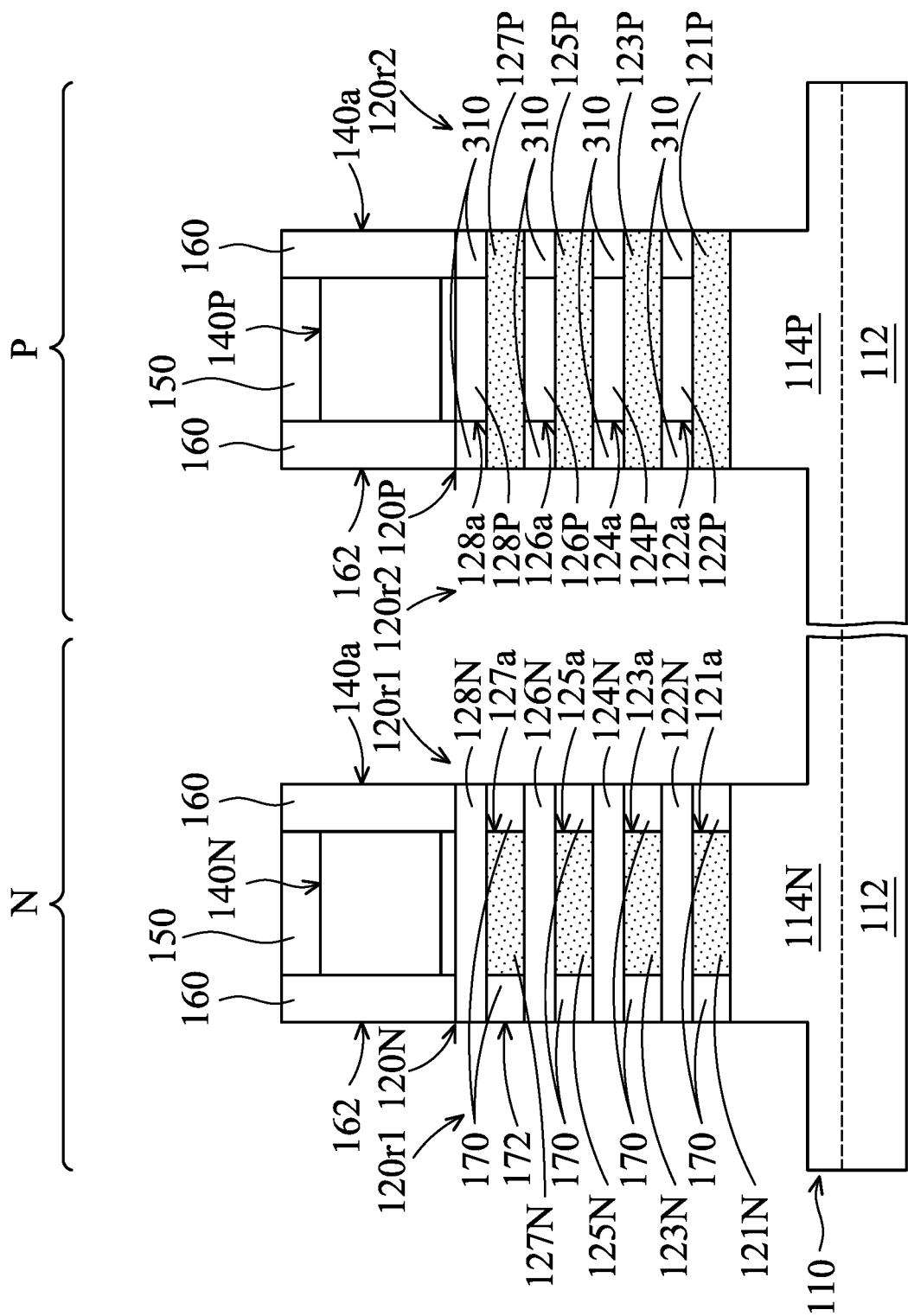
FIGS. 3A-3G are cross-sectional views of various stages of a process for forming a semiconductor device structure, in accordance with some embodiments.

FIGS. 3A-3G are cross-sectional views of various stages of a process for forming a semiconductor device structure, in accordance with some embodiments. After the step of FIG. 1B, as shown in FIG. 3A, portions of the nanostructures 121N, 122P, 123N, 124P, 125N, 126P, 127N and 128P are removed through the trenches 120r1 and 120r2, in accordance with some embodiments. The removal process includes an etching process such as a dry etching process or a wet etching process, in accordance with some embodiments.

As shown in FIG. 3A, an inner spacer layer 170 is formed over the sidewalls 121a, 123a, 125a and 127a of the nanostructures 121N, 123N, 125N and 127N, in accordance with some embodiments. The inner spacer layer 170 is in direct contact with the sidewalls 121a, 123a, 125a and 127a, in accordance with some embodiments.

As shown in FIG. 3A, an inner spacer layer 310 is formed over the sidewalls 122a, 124a, 126a and 128a of the nanostructures 122P, 124P, 126P and 128P, in accordance with some embodiments. The inner spacer layer 310 is in direct contact with the sidewalls 122a, 124a, 126a and 128a, in accordance with some embodiments. As shown in FIG. 3A, sidewalls 172 of the inner spacer layer 170 are substantially aligned with (or substantially coplanar with) the sidewalls 162 of the spacer structure 160, in accordance with some embodiments.

The inner spacer layers 170 and 310 are made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

In some embodiments, the inner spacer layers 170 and 310 are formed using a deposition process and an etching process. The deposition process includes a physical vapor deposition process, a chemical vapor deposition process, an atomic layer deposition process, or the like, in accordance with some embodiments.

In some other embodiments, the inner spacer layers 170 and 310 are formed using a selective deposition process such as an atomic layer deposition process. In some still other embodiments, the removal of the portions of the nanostructures 121N, 122P, 123N, 124P, 125N, 126P, 127N and 128P through the trenches 120r1 and 120r2 is not performed, and the inner spacer layers 170 and 310 are formed by directly oxidizing the portions of the nanostructures 121N, 122P, 123N, 124P, 125N, 126P, 127N and 128P through the trenches 120r1 and 120r2.

Figure 3B:
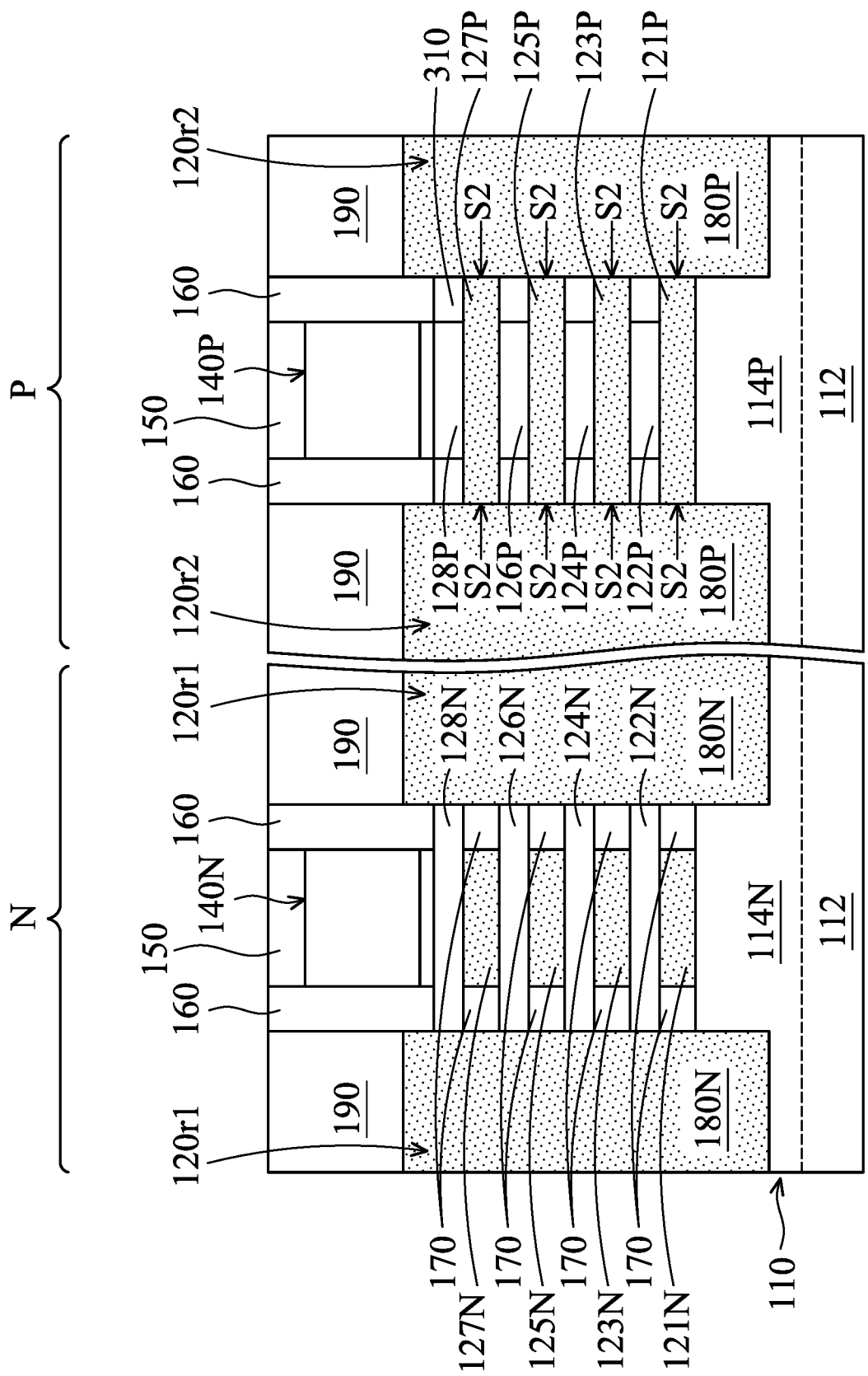

As shown in FIG. 3B, tensile epitaxial structures 180N are formed in the trenches 120r1, in accordance with some embodiments. The nanostructures 122N, 124N, 126N and 128N are between the tensile epitaxial structures 180N, in accordance with some embodiments. The tensile epitaxial structures 180N are in direct contact with the nanostructures 122N, 124N, 126N and 128N, the spacer structure 160, the inner spacer layer 170, and the substrate 110, in accordance with some embodiments.

As shown in FIG. 3B, compressive epitaxial structures 180P are formed in the trenches 120r2, in accordance with some embodiments. The nanostructures 121P, 123P, 125P and 127P are between the compressive epitaxial structures 180P, in accordance with some embodiments. The compressive epitaxial structures 180P are in direct contact with the nanostructures 121P, 123P, 125P and 127P, the spacer structure 160, the inner spacer layer 170, and the substrate 110, in accordance with some embodiments.

The compressive epitaxial structures 180P are used to provide a compressive stress S2 to the nanostructures 121P, 123P, 125P and 127P (i.e. channel structures) so as to induce a compressive strain in the nanostructures 121P, 123P, 125P and 127P, in accordance with some embodiments. The compressive strain is along the longitudinal axis A1 of the nanostructures 121P, 123P, 125P and 127P (or the nanostructures 122N, 124N, 126N and 128N), in accordance with some embodiments. The compressive epitaxial structures 180P are used to be a source structure and a drain structure, in accordance with some embodiments.

Figure 3C:
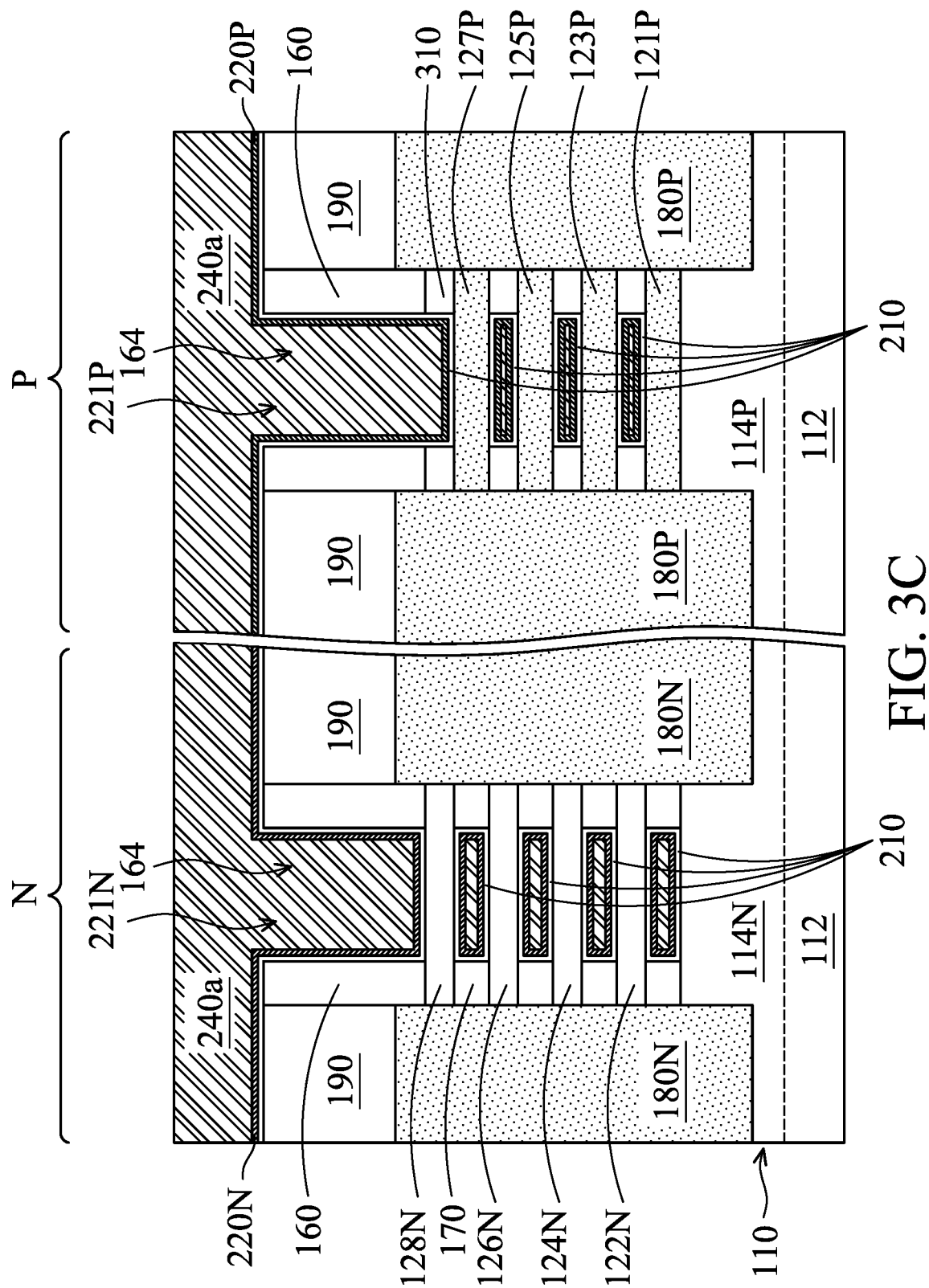

As shown in FIG. 3B, a dielectric layer 190 is formed over the tensile epitaxial structures 180N and the compressive epitaxial structures 180P, in accordance with some embodiments. As shown in FIGS. 3B and 3C, the gate stacks 140N and 140P and the mask layer 150 are removed, in accordance with some embodiments. The removal process forms trenches 164 in the spacer structure 160, in accordance with some embodiments.

As shown in FIG. 3C, the nanostructures 121N, 122P, 123N, 124P, 125N, 126P, 127N and 128P are removed through the trenches 164, in accordance with some embodiments. The removal process for removing the gate stacks 140N and 140P, the mask layer 150 and the nanostructures 121N, 122P, 123N, 124P, 125N, 126P, 127N and 128P includes an etching process such as a wet etching process or a dry etching process, in accordance with some embodiments.

As shown in FIG. 3C, a gate dielectric layer 210 is formed over the nanostructures 122N, 121P, 124N, 123P, 126N, 125P, 128N and 127P, the spacer structure 160, the inner spacer layers 170 and 310, and the dielectric layer 190, in accordance with some embodiments.

The gate dielectric layer 210 surrounds the nanostructures 122N, 121P, 124N, 123P, 126N, 125P, 128N and 127P, in accordance with some embodiments. The gate dielectric layer 210 conformally covers the nanostructures 122N, 121P, 124N, 123P, 126N, 125P, 128N and 127P, the spacer structure 160, the inner spacer layer 170 and the dielectric layer 190, in accordance with some embodiments.

As shown in FIG. 3C, a work function metal layer 220N is conformally formed over the gate dielectric layer 210 in the N-region N, in accordance with some embodiments. As shown in FIG. 3C, a work function metal layer 220P is conformally formed over the gate dielectric layer 210 in the P-region P, in accordance with some embodiments. As shown in FIG. 3C, a compressive gate electrode material layer 240a is formed over the work function metal layers 220N and 220P, in accordance with some embodiments.

Figure 3D:
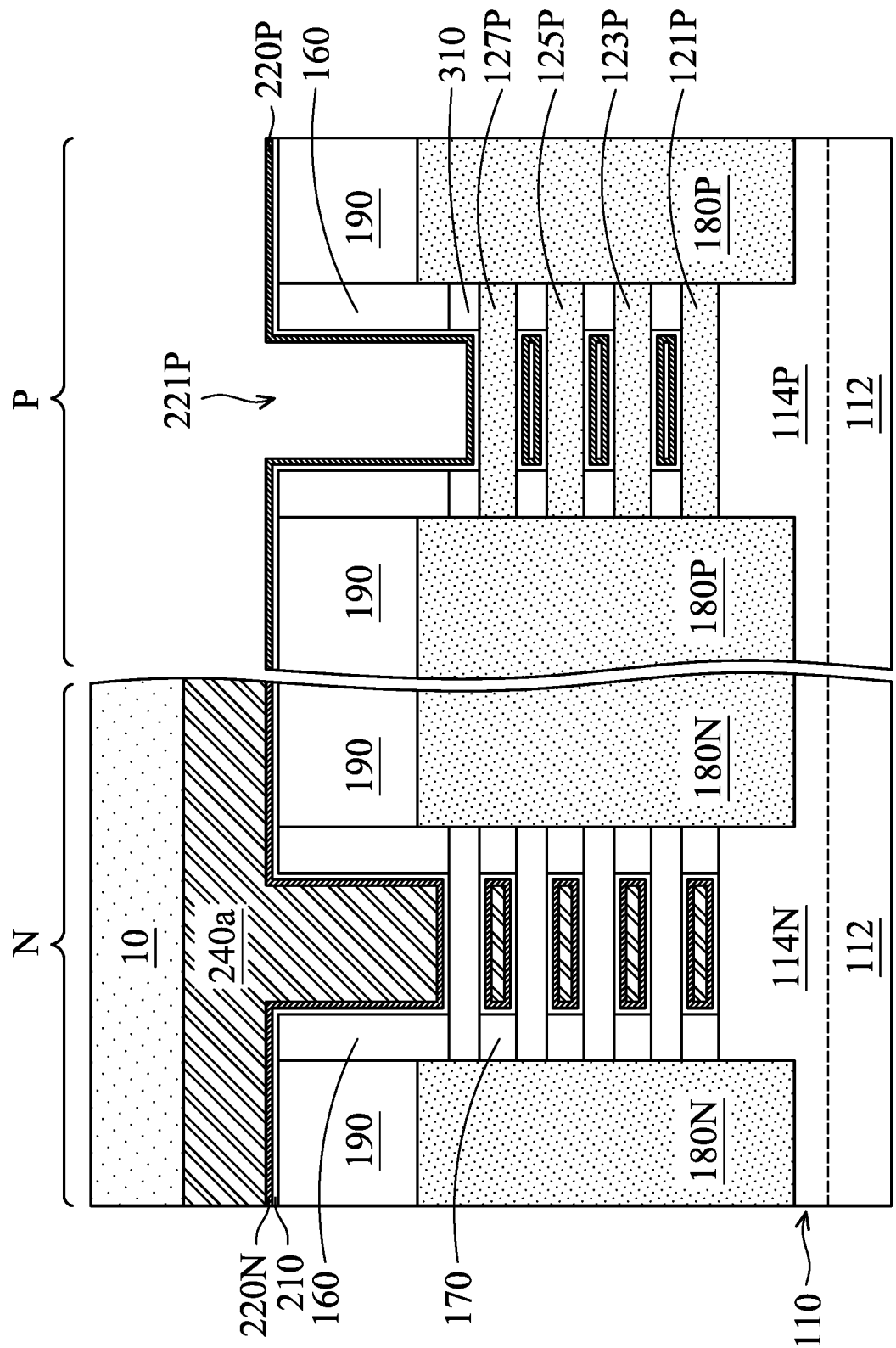

As shown in FIG. 3D, a mask layer 10 is formed over the compressive gate electrode material layer 240a in the N-region N, in accordance with some embodiments. As shown in FIG. 3D, the compressive gate electrode material layer 240a, which is not covered by the mask layer 10, is removed, in accordance with some embodiments. The removal process includes an etching process, in accordance with some embodiments.

Figure 3E:
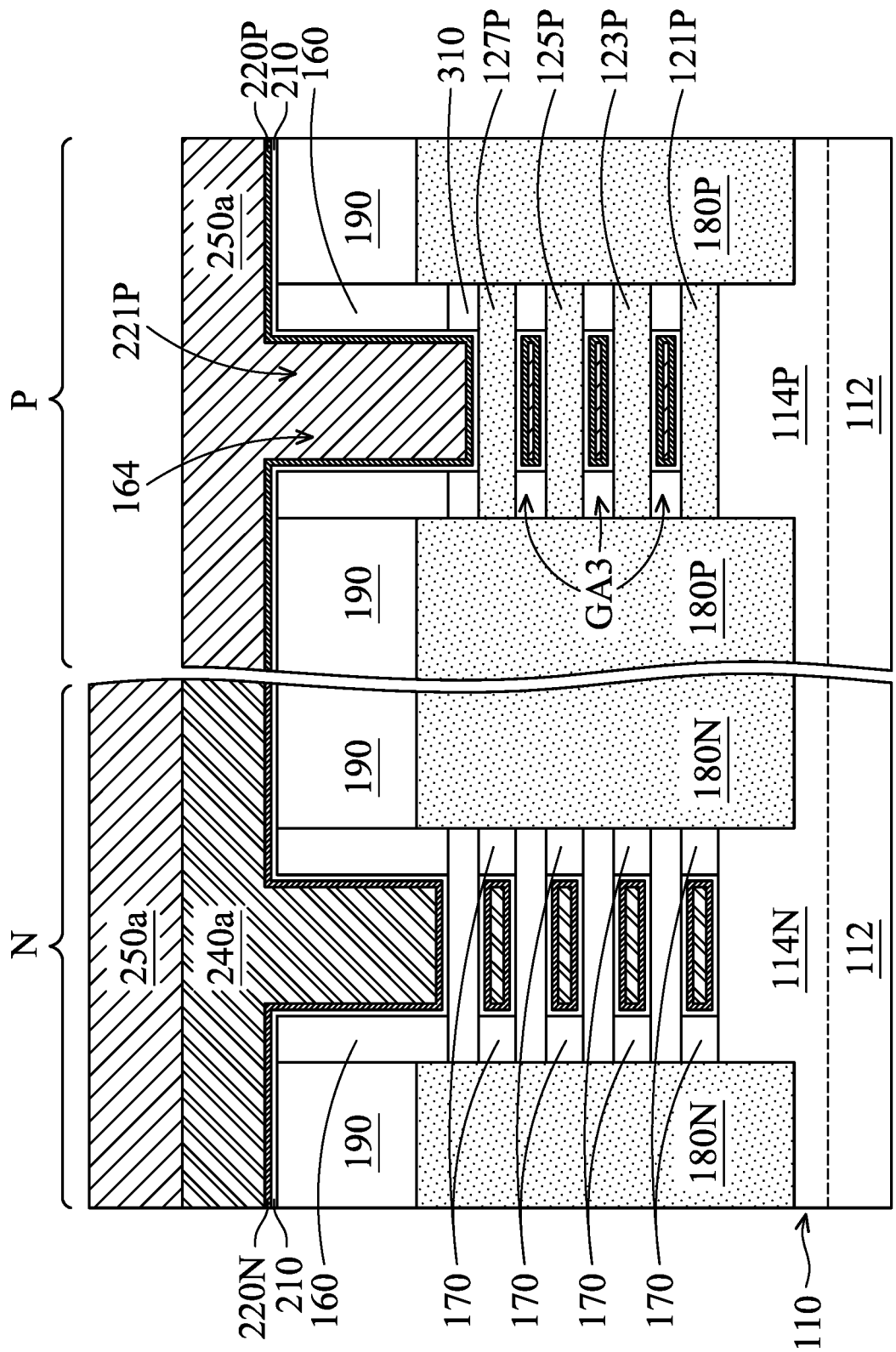

As shown in FIG. 3E, the mask layer 10 is removed, in accordance with some embodiments. As shown in FIG. 3E, a tensile gate electrode material layer 250a is formed over the work function metal layer 220P and the compressive gate electrode material layer 240a, in accordance with some embodiments. The trench 164 of the spacer structure 160 (or the recess 221P of the work function metal layer 220P) and the gaps GA3 between the nanostructures 121P, 123P, 125P, and 127P are completely filled with the tensile gate electrode material layer 250a, in accordance with some embodiments.

Figure 3F:
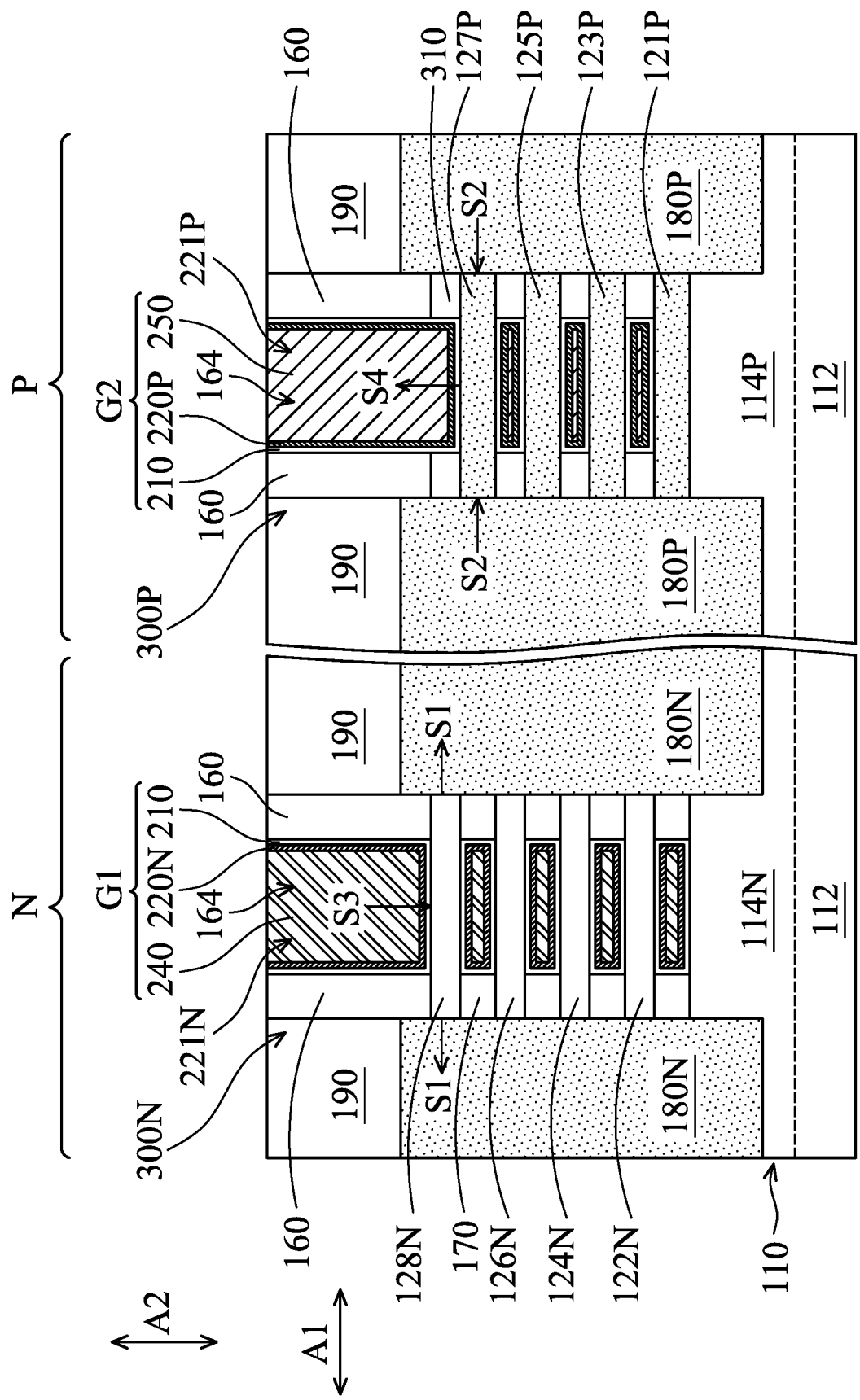

As shown in FIG. 3F, the compressive gate electrode material layer 240a and the tensile gate electrode material layer 250a outside of the trenches 164 are removed, in accordance with some embodiments. The compressive gate electrode material layer 240a remaining in the trench 164 forms a compressive gate electrode layer 240, in accordance with some embodiments.

The compressive gate electrode layer 240 surrounds the nanostructures 122N, 124N, 126N, and 128N, in accordance with some embodiments. The compressive gate electrode layer 240, the work function metal layer 220N, and the gate dielectric layer 210 thereunder together form a gate stack G1, in accordance with some embodiments.

The tensile gate electrode material layer 250a remaining in the trench 164 forms a tensile gate electrode layer 250, in accordance with some embodiments. The tensile gate electrode layer 250 surrounds the nanostructures 121P, 123P, 125P, and 127P, in accordance with some embodiments.

The tensile gate electrode layer 250, the work function metal layer 220P, and the gate dielectric layer 210 thereunder together form a gate stack G2, in accordance with some embodiments. The removal process includes a planarization process such as a chemical mechanical polishing process, in accordance with some embodiments.

In this step, an NMOS transistor 300N and a PMOS transistor 300P are substantially formed, in accordance with some embodiments. The NMOS transistor 300N includes the gate stack G1, the nanostructures 122N, 124N, 126N, and 128N, and the tensile epitaxial structures 180N, in accordance with some embodiments. The PMOS transistor 300P includes the gate stack G2, the nanostructures 121P, 123P, 125P and 127P, and the compressive epitaxial structures 180P, in accordance with some embodiments.

Figure 3G:
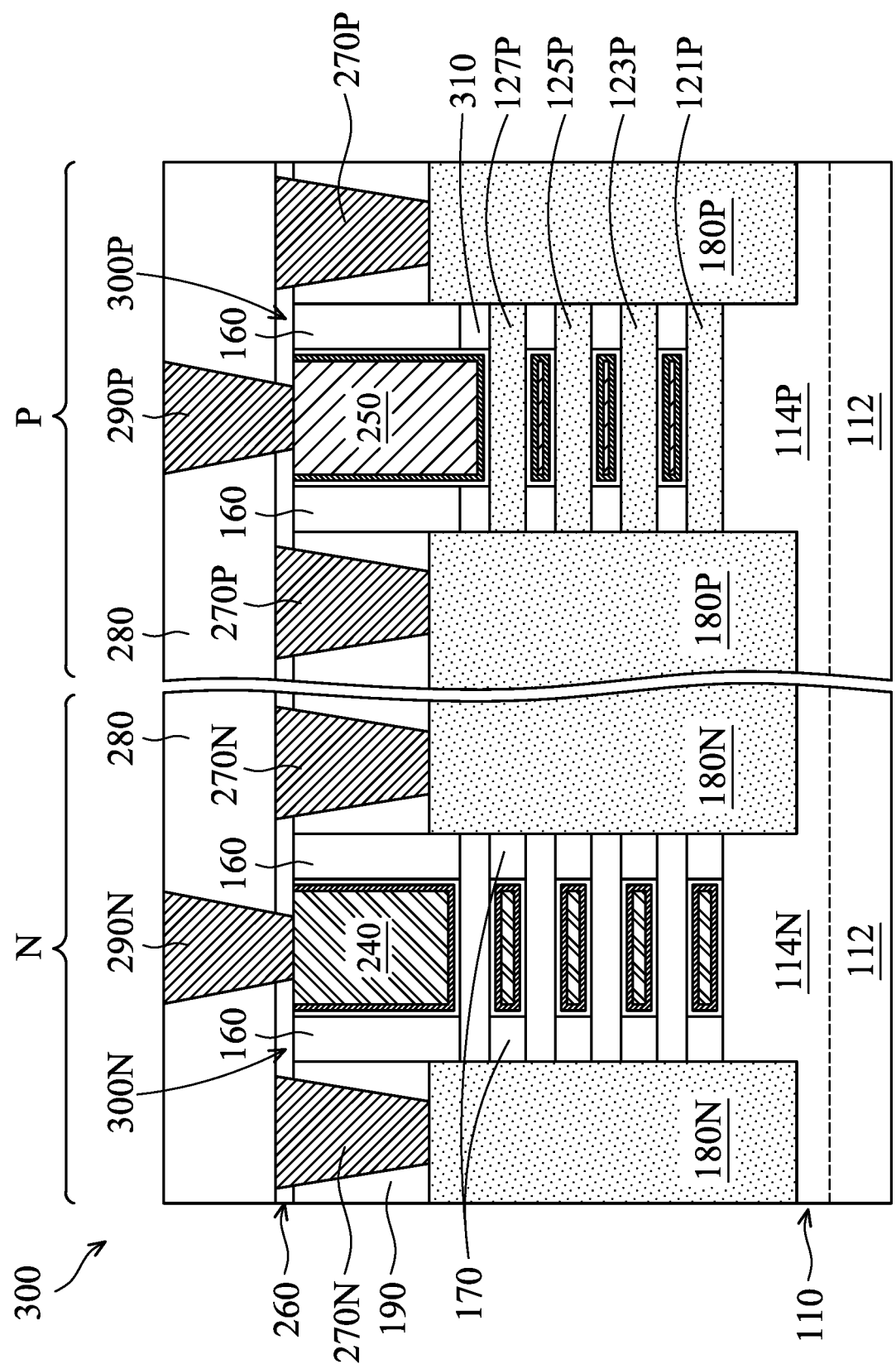

After performing the steps of FIGS. 1J-1K, as shown in FIG. 3G, an etching stop layer 260, contact structures 270N and 270P, a dielectric layer 280, and contact structures 290N and 290P are formed, in accordance with some embodiments. In this step, a semiconductor device structure 300 is substantially formed, in accordance with some embodiments.

Processes and materials for forming the semiconductor structures 200 and 300 may be similar to, or the same as, those for forming the semiconductor structure 100 described above.

In accordance with some embodiments, semiconductor device structures and methods for forming the same are provided. The methods (for forming the semiconductor device structure) form a compressive gate electrode layer in an NMOS transistor and form a tensile gate electrode layer in a PMOS transistor. The compressive gate electrode layer provides a compressive stress to channel structures of the NMOS transistor to improve the carrier mobility of the channel structures and therefore improve the performance of the NMOS transistor. The tensile gate electrode layer provides a tensile stress to channel structures of the PMOS transistor to improve the carrier mobility of the channel structures and therefore improve the performance of the PMOS transistor.

In accordance with some embodiments, a method for forming a semiconductor device structure is provided. The method includes providing a substrate, a plurality of first nanostructures, a plurality of second nanostructures, two tensile epitaxial structures, two compressive epitaxial structures, and a dielectric layer over the substrate. The first nanostructures are between and connected to the tensile epitaxial structures, the second nanostructures are between and connected to the compressive epitaxial structures, the dielectric layer is over the tensile epitaxial structures and the compressive epitaxial structures, and the dielectric layer has a first trench and a second trench passing through the dielectric layer and respectively over the first nanostructures and the second nanostructures. The method includes forming a gate dielectric layer over the first nanostructures and the second nanostructures. The method includes forming a first work function metal layer over the gate dielectric layer over the first nanostructures. The method includes forming a second work function metal layer over the gate dielectric layer over the second nanostructures. The method includes forming a compressive gate electrode layer over the first work function metal layer using an atomic layer deposition process or a chemical vapor deposition process. The compressive gate electrode layer fills the first trench and surrounds the first nanostructures. The method includes forming a tensile gate electrode layer over the second work function metal layer using a physical vapor deposition process. The tensile gate electrode layer fills the second trench and surrounds the second nanostructures.

In accordance with some embodiments, a method for forming a semiconductor device structure is provided. The method includes providing a substrate, a plurality of first nanostructures, a plurality of second nanostructures, two tensile epitaxial structures, two compressive epitaxial structures, and a dielectric layer over the substrate. The first nanostructures are between and connected to the tensile epitaxial structures, the second nanostructures are between and connected to the compressive epitaxial structures, the dielectric layer is over the tensile epitaxial structures and the compressive epitaxial structures, and the dielectric layer has a first trench and a second trench passing through the dielectric layer and respectively over the first nanostructures and the second nanostructures. The method includes forming a gate dielectric layer over the first nanostructures and the second nanostructures. The method includes forming a compressive gate electrode layer over the gate dielectric layer covering the first nanostructures using an atomic layer deposition process or a chemical vapor deposition process. The compressive gate electrode layer fills the first trench and surrounds the first nanostructures, and the compressive gate electrode layer is in direct contact with the gate dielectric layer. The method includes forming a tensile gate electrode layer over the gate dielectric layer covering the second nanostructures using a physical vapor deposition process. The tensile gate electrode layer fills the second trench and surrounds the second nanostructures, and the tensile gate electrode layer is in direct contact with the gate dielectric layer.

In accordance with some embodiments, a method for forming a semiconductor device structure is provided. The method includes providing a substrate, a plurality of first nanostructures, a plurality of second nanostructures, two tensile epitaxial structures, two compressive epitaxial structures, and a dielectric layer over the substrate. The first nanostructures are between and connected to the tensile epitaxial structures, the second nanostructures are between and connected to the compressive epitaxial structures, the first nanostructures and the second nanostructures are made of different materials, the lowest one of the second nanostructures is in direct contact with the substrate, the dielectric layer is over the tensile epitaxial structures and the compressive epitaxial structures, and the dielectric layer has a first trench and a second trench passing through the dielectric layer and respectively exposing the first nanostructures and the second nanostructures. The method includes forming a gate dielectric layer over the first nanostructures and the second nanostructures. The method includes forming a first work function metal layer over the gate dielectric layer over the first nanostructures. The method includes forming a second work function metal layer over the gate dielectric layer over the second nanostructures. The method includes forming a compressive gate electrode layer over the first work function metal layer using a chemical vapor deposition process. The compressive gate electrode layer fills the first trench and surrounds the first nanostructures. The method includes forming a tensile gate electrode layer over the second work function metal layer using a physical vapor deposition process or an atomic layer deposition process. The tensile gate electrode layer fills the second trench and surrounds the second nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    providing a substrate, a plurality of first nanostructures, a plurality of second nanostructures, two tensile epitaxial structures, two compressive epitaxial structures, and a dielectric layer over the substrate,
    wherein the first nanostructures are between and connected to the tensile epitaxial structures, the second nanostructures are between and connected to the compressive epitaxial structures, the dielectric layer is over the tensile epitaxial structures and the compressive epitaxial structures, and the dielectric layer has a first trench and a second trench passing through the dielectric layer and respectively positioned over the first nanostructures and the second nanostructures;
    forming a gate dielectric layer over the first nanostructures and the second nanostructures;
    forming a first work function metal layer over the gate dielectric layer over the first nanostructures;
    forming a second work function metal layer over the gate dielectric layer over the second nanostructures;
    forming a compressive gate electrode layer over the first work function metal layer using an atomic layer deposition process or a chemical vapor deposition process, wherein the compressive gate electrode layer fills the first trench and surrounds the first nanostructures; and
    forming a tensile gate electrode layer over the second work function metal layer using a physical vapor deposition process, wherein the tensile gate electrode layer fills the second trench and surrounds the second nanostructures.

2. The method for forming the semiconductor device structure as claimed in claim 1, wherein the compressive gate electrode layer and the tensile gate electrode layer are made of different materials, the compressive gate electrode layer induces a first compressive strain in the first nanostructures, the tensile gate electrode layer induces a first tensile strain in the second nanostructures, the first nanostructures are over a top surface of the substrate, the first compressive strain and the first tensile strain are along an axis perpendicular to the top surface,
    the tensile epitaxial structures induce a second tensile strain in the first nanostructures, the compressive epitaxial structures induce a second compressive strain in the second nanostructures, and the second tensile strain and the second compressive strain are along a longitudinal axis of the first nanostructures.

3. The method for forming the semiconductor device structure as claimed in claim 1, wherein the forming of the compressive gate electrode layer over the first work function metal layer and the forming of the tensile gate electrode layer over the second work function metal layer comprise:
    depositing a compressive gate electrode material layer in the first trench and the second trench;
    removing the compressive gate electrode material layer in the second trench;
    depositing a tensile gate electrode material layer in the second trench and over the compressive gate electrode material layer; and
    removing the compressive gate electrode material layer and the tensile gate electrode material layer outside of the first trench and the second trench.

4. The method for forming the semiconductor device structure as claimed in claim 1, wherein the compressive gate electrode layer is made of metal, metal nitride, or metal carbide.

5. The method for forming the semiconductor device structure as claimed in claim 1, wherein the tensile gate electrode layer is made of metal nitride or metal carbide.

6. The method for forming the semiconductor device structure as claimed in claim 1, further comprising:
    after forming the tensile gate electrode layer, forming a first contact structure and a second contact structure respectively over the compressive gate electrode layer and the tensile gate electrode layer, wherein the first contact structure is in direct contact with the compressive gate electrode layer, and the second contact structure is in direct contact with the tensile gate electrode layer.

7. The method for forming the semiconductor device structure as claimed in claim 1, wherein the compressive gate electrode layer is thicker than the first work function metal layer.

8. The method for forming the semiconductor device structure as claimed in claim 1, wherein the compressive gate electrode layer is thicker than the dielectric layer.

9. The method for forming the semiconductor device structure as claimed in claim 1, wherein the first semiconductor nanostructures are spaced apart by first gaps, and the compressive gate electrode layer fills the first gaps.

10. The method for forming the semiconductor device structure as claimed in claim 9, wherein the second semiconductor nanostructures are spaced apart by second gaps, and the tensile gate electrode layer fills the second gaps.

11. A method for forming a semiconductor device structure, comprising:
    providing a substrate, a plurality of first nanostructures, a plurality of second nanostructures, two tensile epitaxial structures, two compressive epitaxial structures, and a dielectric layer over the substrate,
    wherein the first nanostructures are between and connected to the tensile epitaxial structures, the second nanostructures are between and connected to the compressive epitaxial structures, the dielectric layer is over the tensile epitaxial structures and the compressive epitaxial structures, and the dielectric layer has a first trench and a second trench passing through the dielectric layer and respectively over the first nanostructures and the second nanostructures;

forming a gate dielectric layer over the first nanostructures and the second nanostructures;

forming a compressive gate electrode layer over the gate dielectric layer covering the first nanostructures using an atomic layer deposition process or a chemical vapor deposition process, wherein the compressive gate electrode layer fills the first trench and surrounds the first nanostructures, and the compressive gate electrode layer is in direct contact with the gate dielectric layer; and forming a tensile gate electrode layer over the gate dielectric layer covering the second nanostructures using a physical vapor deposition process, wherein the tensile gate electrode layer fills the second trench and surrounds the second nanostructures, and the tensile gate electrode layer is in direct contact with the gate dielectric layer.

12. The method for forming the semiconductor device structure as claimed in claim 11, wherein the compressive gate electrode layer and the tensile gate electrode layer are made of different materials, the compressive gate electrode layer induces a compressive strain in the first nanostructures, the tensile gate electrode layer induces a tensile strain in the second nanostructures, the first nanostructures are over a top surface of the substrate, and the compressive strain and the tensile strain are along an axis perpendicular to the top surface.

13. The method for forming the semiconductor device structure as claimed in claim 12, wherein the compressive gate electrode layer is made of tungsten, titanium nitride, tantalum nitride, titanium aluminide, or titanium carbide.

14. The method for forming the semiconductor device structure as claimed in claim 12, wherein the tensile gate electrode layer is made of titanium nitride, tantalum nitride, titanium-aluminum carbide, or titanium carbide.

15. The method for forming the semiconductor device structure as claimed in claim 11, wherein the forming of the compressive gate electrode layer over the gate dielectric layer covering the first nanostructures and the forming of the tensile gate electrode layer over the gate dielectric layer covering the second nanostructures comprise:

depositing a compressive gate electrode material layer in the first trench and the second trench and on the gate dielectric layer;

removing the compressive gate electrode material layer in the second trench;

depositing a tensile gate electrode material layer in the second trench and on the compressive gate electrode material layer; and removing the compressive gate electrode material layer and the tensile gate electrode material layer outside of the first trench and the second trench.

16. A method for forming a semiconductor device structure, comprising:

providing a substrate, a plurality of first nanostructures, a plurality of second nanostructures, two tensile epitaxial structures, two compressive epitaxial structures, and a dielectric layer over the substrate, wherein the first nanostructures are between and connected to the tensile epitaxial structures, the second nanostructures are between and connected to the compressive epitaxial structures, the first nanostructures and the second nanostructures are made of different materials, the lowest one of the second nanostructures is in direct contact with the substrate, the dielectric layer is over the tensile epitaxial structures and the compressive epitaxial structures, and the dielectric layer has a first trench and a second trench passing through the dielectric layer and respectively exposing the first nanostructures and the second nanostructures;

forming a gate dielectric layer over the first nanostructures and the second nanostructures;

forming a first work function metal layer over the gate dielectric layer over the first nanostructures;

forming a second work function metal layer over the gate dielectric layer over the second nanostructures;

forming a compressive gate electrode layer over the first work function metal layer using a chemical vapor deposition process, wherein the compressive gate electrode layer fills the first trench and surrounds the first nanostructures; and forming a tensile gate electrode layer over the second work function metal layer using a physical vapor deposition process or an atomic layer deposition process, wherein the tensile gate electrode layer fills the second trench and surrounds the second nanostructures.

17. The method for forming the semiconductor device structure as claimed in claim 16, wherein the tensile gate electrode layer formed using the atomic layer deposition process is made of titanium nitride or ruthenium.

18. The method for forming the semiconductor device structure as claimed in claim 16, wherein the compressive gate electrode layer and the tensile gate electrode layer are made of different materials, the compressive gate electrode layer induces a compressive strain in the first nanostructures, the tensile gate electrode layer induces a tensile strain in the second nanostructures, the first nanostructures are over a top surface of the substrate, and the compressive strain and the tensile strain are along an axis perpendicular to the top surface.

19. The method for forming the semiconductor device structure as claimed in claim 16, wherein the first nanostructures and the substrate are made of a same material.

20. The method for forming the semiconductor device structure as claimed in claim 16, further comprising:

after forming the tensile gate electrode layer, forming a first contact structure and a second contact structure respectively over the compressive gate electrode layer and the tensile gate electrode layer, wherein the first contact structure is in direct contact with the compressive gate electrode layer, and the second contact structure is in direct contact with the tensile gate electrode layer.

* * * * *